US012777800B2

(12) United States Patent
Hayashi

(10) Patent No.: US 12,777,800 B2
(45) Date of Patent: Oct. 27, 2026

(54) DISPLAY DEVICE

(71) Applicant: Sharp Display Technology Corporation, Kameyama City (JP)

(72) Inventor: Takao Hayashi, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 183 days.

(21) Appl. No.: 18/700,177

(22) PCT Filed: Dec. 29, 2021

(86) PCT No.: PCT/JP2021/049016
§ 371 (c)(1),
(2) Date: Apr. 10, 2024

(87) PCT Pub. No.: WO2023/127161
PCT Pub. Date: Jun. 7, 2023

(65) Prior Publication Data

US 2024/0407213 A1 Dec. 5, 2024

(51) Int. Cl.
*H10K 59/131* (2023.01)
*H10K 59/121* (2023.01)
*H10K 59/88* (2023.01)

(52) U.S. Cl.
CPC ....... *H10K 59/131* (2023.02); *H10K 59/1213* (2023.02); *H10K 59/88* (2023.02)

(58) Field of Classification Search
CPC ... H10K 59/131; H10K 59/1213; H10K 59/88
See application file for complete search history.

(56) References Cited

U.S. PATENT DOCUMENTS 11,537,012 B2 * 12/2022 Yoshida ................ G02F 1/1345
2012/0229712 A1 9/2012 Yoshida et al.
2015/0077656 A1 * 3/2015 Ito ......................... G06F 3/0445 264/261
2016/0131933 A1 5/2016 Yoshida et al.
2017/0090256 A1 3/2017 Miyamoto et al.
2017/0261822 A1 9/2017 Miyamoto et al.
2018/0040683 A1 2/2018 Matsueda et al.
2018/0246383 A1 8/2018 Miyamoto et al.
2018/0366680 A1 * 12/2018 Okigawa .............. H10K 59/131
2019/0033648 A1 1/2019 Yoshida et al.
2019/0096914 A1 3/2019 Hosokawa et al.
(Continued)

FOREIGN PATENT DOCUMENTS

JP 2017-067830 A 4/2017
JP 2018-022117 A 2/2018
(Continued)

*Primary Examiner* — Nathan W Ha
(74) *Attorney, Agent, or Firm* — ScienBiziP, P.C.

(57) ABSTRACT

A display device includes: a display region; and a picture-frame region provided outside the display region. A trunk wire forming region is provided between a first unit circuit block and a second unit circuit block in the picture-frame region. The trunk wire forming region includes: a first gate-clock-signal trunk wire; a second gate-clock-signal trunk wire; a first constant-voltage trunk wire; a second constant-voltage trunk wire; and a control-signal trunk wire. The trunk wire forming region is provided with: a set signal line; and a dummy element.

16 Claims, 15 Drawing Sheets

(56) References Cited

U.S. PATENT DOCUMENTS

| | | | |
|---|---|---|---|
| 2019/0155114 | A1 | 5/2019 | Miyamoto et al. |
| 2019/0189721 | A1 | 6/2019 | Kim et al. |
| 2020/0019028 | A1 | 1/2020 | Miyamoto et al. |
| 2020/0135764 | A1 | 4/2020 | Ha et al. |
| 2020/0235129 | A1 | 7/2020 | Hosokawa et al. |
| 2021/0103176 | A1 | 4/2021 | Yoshida et al. |
| 2022/0037367 | A1 | 2/2022 | Hosokawa et al. |
| 2022/0367597 | A1* | 11/2022 | Nishiyama ......... H10K 59/1216 |
| 2024/0029608 | A1* | 1/2024 | Li ........................ G09G 3/3674 |

FOREIGN PATENT DOCUMENTS

| | | | |
|---|---|---|---|
| JP | 2019-109506 | A | 7/2019 |
| JP | 2021-193450 | A | 12/2021 |
| WO | 2011/067963 | A1 | 6/2011 |

* cited by examiner

DISPLAY DEVICE

TECHNICAL FIELD

The present disclosure relates to a display device.

BACKGROUND ART

Display devices in recent years have a narrower picture-frame region provided around a display region, in order to increase the size of the display region. Simultaneously, robust developments are proceeding for the display devices to have a gate-on-panel (GOP) scan drive circuit directly formed on the narrow picture-frame region.

Patent Document 1 describes a display device having a non-rectangular scan drive circuit in a picture-frame region.

CITATION LIST

Patent Literature

[Patent Document 1] Japanese Unexamined Patent Application Publication No. 2018-022117

SUMMARY

Technical Problem

The inventors of the disclosure have noticed that, if a scan drive circuit has such a shape as that of the non-rectangular scan drive circuit described in Patent Document 1, a horizontal line is likely to appear on an image displayed on the display region because, among the unit circuits included in the scan drive circuit, unit circuits arranged in a changing direction are different in layout from unit circuits arranged in the same direction. Then, the inventors of the disclosure have noticed that the horizontal line appears on an image of the display region when unit circuits of the scan drive circuit include transistors having an oxide semiconductor layer, and when, in the layouts of the unit circuits, the oxide semiconductor layers are arranged in different layouts.

An aspect of the present disclosure is conceived in view of the above problem, and sets out to provide a display device that can keep a horizontal line from appearing on an image displayed on a display region even if the display device includes a non-rectangular scan drive circuit including: a first unit circuit block having a plurality of unit circuits arranged side by side in a first direction; and a second unit circuit block having a plurality of unit circuits arranged side by side in a second direction not in parallel with the first direction.

Solution to Problem

In order to solve the above problem, a display device according to the present disclosure includes:

a substrate; a display region provided on the substrate; and a picture-frame region provided on the substrate and disposed outside the display region, the display region including a plurality of subpixels and a subpixel drive circuit included in each of the plurality of subpixels, wherein the picture-frame region includes:

a first gate-clock-signal trunk wire; a second gate-clock-signal trunk wire supplied with a clock signal different from a clock signal supplied to the first gate-clock-signal trunk wire; a first constant-voltage trunk wire and; a second constant-voltage trunk wire supplied with a constant voltage higher than a constant voltage supplied to the first constant-voltage trunk wire, all of which are provided along the picture-frame region;

a unit circuit provided with a transistor including a first oxide semiconductor layer, a first gate electrode, a first source electrode, and a first drain electrode, the unit circuit being configured to output at least one or more output signals to the subpixel drive circuit of a corresponding subpixel included in the plurality of subpixels, and the at least one or more output signals being output in accordance with a first gate clock signal from the first gate-clock-signal trunk wire, a second gate clock signal from the second gate-clock-signal trunk wire, a first constant voltage from the first constant-voltage trunk wire, a second constant voltage from the second constant-voltage trunk wire, and a set signal;

a first unit circuit block provided along a section of a region in which the first gate-clock-signal trunk wire, the second gate-clock-signal trunk wire, the first constant-voltage trunk wire, and the second constant-voltage trunk wire extend, the first unit circuit block including a plurality of the unit circuits arranged side by side in a first direction of the substrate;

a second unit circuit block provided along another section of the region in which the first gate-clock-signal trunk wire, the second gate-clock-signal trunk wire, the first constant-voltage trunk wire, and the second constant-voltage trunk wire extend, the second unit circuit block including the plurality of unit circuits arranged side by side in a second direction of the substrate, and the second direction being not in parallel with the first direction; and a trunk wire forming region provided between the first unit circuit block and the second unit circuit block, and including the first gate-clock-signal trunk wire, the second gate-clock-signal trunk wire, the first constant-voltage trunk wire, and the second constant-voltage trunk wire, the trunk line forming region is provided with a set signal line supplied with the set signal sent from a unit circuit included in the plurality of unit circuits in the first unit circuit block and provided closest to the second unit circuit block to a unit circuit included in the plurality of unit circuits in the second unit circuit block and provided closest to the first unit circuit block, and the trunk line forming region is provided with one or more dummy elements each including: a second oxide semiconductor layer formed of a same material as a material of the first oxide semiconductor layer; and a second gate electrode formed of a same material as a material of the first gate electrode overlapping with the second oxide semiconductor layer in plan view.

Advantageous Effects of Invention

An aspect of the present disclosure can provide a display device that can keep a horizontal line from appearing on an image displayed on a display region even if the display device includes a non-rectangular scan drive circuit including: a first unit circuit block having a plurality of unit circuits arranged side by side in a first direction; and a second unit circuit block having a plurality of unit circuits arranged side by side in a second direction not in parallel with the first direction.

DESCRIPTION OF EMBODIMENTS

Described below are embodiments of the disclosure, with reference to FIGS. 1 to 17. For convenience in description, like reference signs designate identical constituent features throughout the embodiments. These constituent features will not be elaborated upon.

First Embodiment

Figure 1:
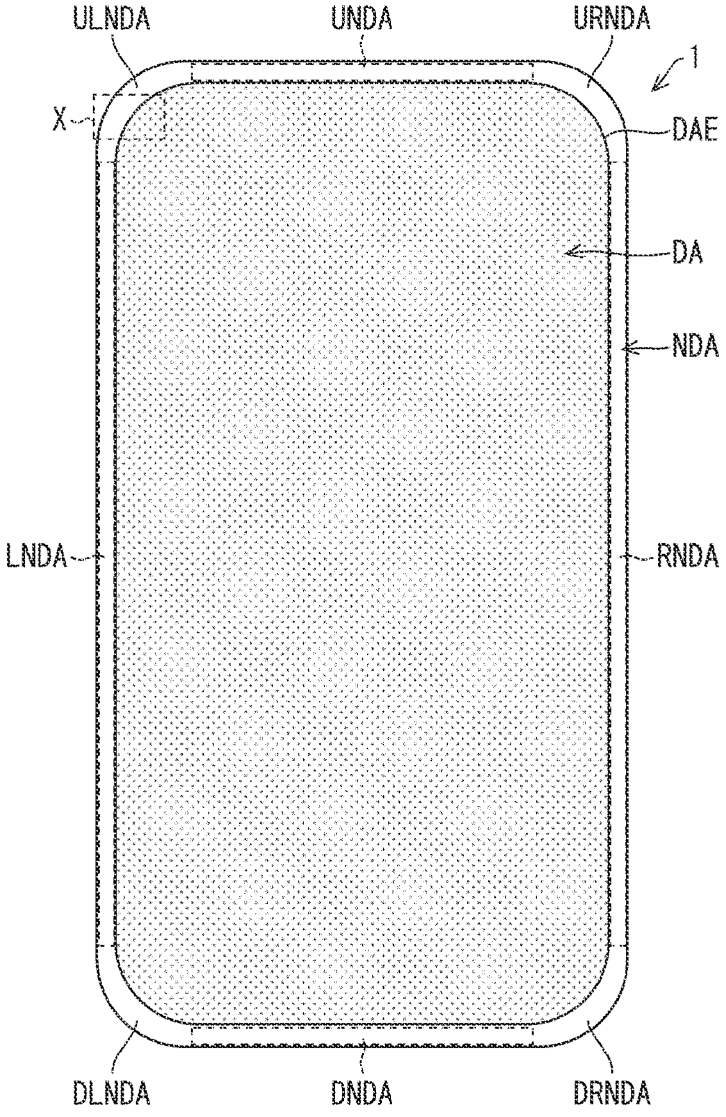
FIG. 1 is a plan view schematically illustrating a configuration of a display device according to a first embodiment.

FIG. 1 is a plan view schematically illustrating a configuration of a display device 1 according to a first embodiment.

As illustrated in FIG. 1, the display device 1 includes: a not-shown substrate; a display region DA provided on the substrate; and a picture-frame region NDA provided on the substrate and disposed outside the display region DA. The display region DA includes a plurality of subpixels and a subpixel drive circuit included in each of the plurality of subpixels. The subpixel drive circuit will be described later.

The picture-frame region NDA includes: a rectangular upper-picture-frame region UNDA; a rectangular right-picture-frame region RNDA; a rectangular lower-picture-frame region DNDA; a rectangular left-picture-frame region LNDA; a modified-shaped portion (an upper-right modified-shaped portion) URND connecting the rectangular upper-picture-frame region UNDA and the rectangular right-picture-frame region RNDA; a modified-shaped portion (a lower-right modified-shaped portion) DRNDA connecting the rectangular right-picture-frame region RNDA and the rectangular lower-picture-frame region DNDA; a modified-shaped portion (a lower-left modified-shaped portion) DLNDA connecting the rectangular lower-picture-frame region DNDA and the rectangular left-picture-frame region LNDA; and a modified-shaped portion (an upper-left modified-shaped portion) ULNDA connecting the rectangular left-picture-frame region LNDA and the rectangular upper-picture-frame region UNDA. Note that each modified-shaped portion may include a curved end face as illustrated in FIG. 1, or may include a not-shown slanted end face.

The display region DA includes a modified-shaped end portion DAE formed along a modified-shaped portion of the picture-frame region NDA. The display region DA includes a plurality of pixels. Each of the pixels includes, for example, a red subpixel, a green subpixel, and a blue subpixel. This embodiment exemplifies, but is not limited to, a case where one pixel includes a red subpixel, a green subpixel, and a blue subpixel. For example, one pixel may further include a subpixel in another color, in addition to the red subpixel, the green subpixel, and the blue subpixel.

As described above, this embodiment describes a case where the picture-frame region NDA includes a modified-shaped portion connecting rectangular picture-frame regions together. However, the picture-frame region NDA may have any given shape as long as the picture-frame region NDA includes a non-rectangular scan drive circuit (a gate drive driver). Hence, also the display region DA has any given shape.

Figure 2:
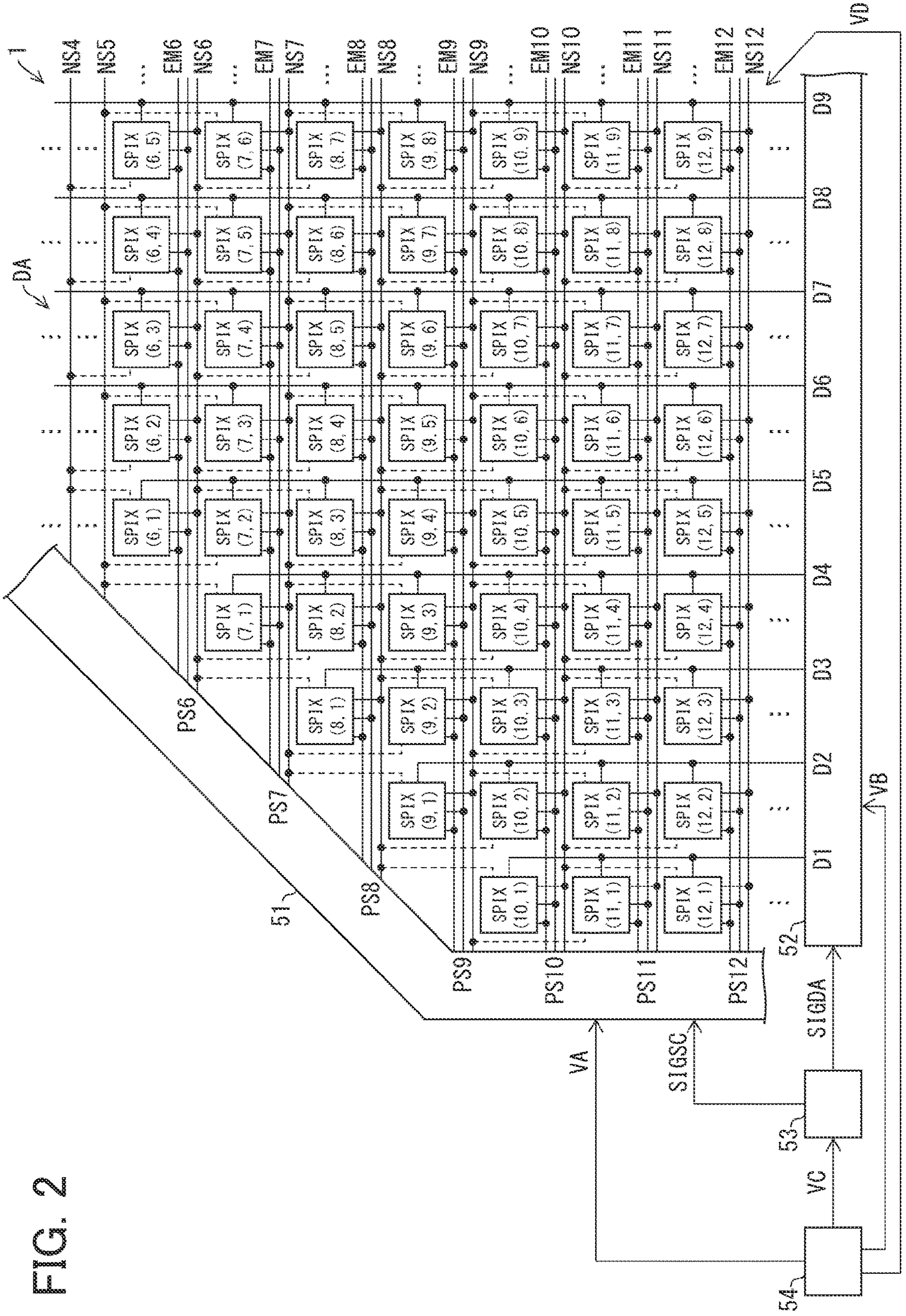
FIG. 2 is a diagram illustrating: subpixels and a portion of a scan drive circuit provided to an X portion of the display device according to the first embodiment in FIG. 1; and a portion of a data drive circuit included in the display device, a display control circuit, and a power supply circuit according to the first embodiment in FIG. 1.

FIG. 2 is a diagram illustrating: a plurality of subpixels SPIX and a portion of a scan drive circuit 51 provided to an X portion of the display device 1 according to the first embodiment in FIG. 1; and a portion of a data drive circuit 52, a display control circuit 53, and a power supply circuit 54 included in the display device 1 according to the first embodiment in FIG. 1.

The X portion of the display device 1 according to the first embodiment illustrated in FIG. 1 includes: the modified-shaped portion (the upper left modified-shaped portion) ULNDA of the picture-frame region NDA; and the modified-shaped end portion DAE of the display region DA formed along the modified-shaped portion ULNDA of the picture-frame region NDA.

As illustrated in FIG. 2, the display region DA of the display device 1 is provided with: a plurality of data signal lines extending in the vertical direction in the drawing (in FIG. 2, only data signal lines D1 to D9 are illustrated); a plurality of first scan signal lines extending in the horizontal direction in the drawing (in FIG. 2, only first scan signal lines NS4 to NS12 are illustrated); a plurality of second scan signal lines extending in the horizontal direction in the drawing (in FIG. 2, only second scan signal lines PS6 to PS12 are illustrated); and a plurality of light-emission control lines extending in the horizontal direction in the drawing (in FIG. 2, only light-emission control lines EM6 to EM12 are illustrated).

Furthermore, the display region DA of the display device 1 includes the plurality of subpixels SPIX (in FIG. 2, only subpixels SPIX (6, 1) to SPIX (12, 9) are illustrated). Each of the subpixels SPIX includes a subpixel drive circuit to be described later (see FIG. 12). For example, the subpixel drive circuit included in the subpixel SPIX (6, 1) is supplied with: a data signal through the data signal line D5; two kinds of first output signals through the first scan signal line NS4 and the first scan signal line NS6; a second output signal through the second scan signal line PS6; and a light-emission control signal through the light-emission control line EM6.

As illustrated in FIG. 2, the picture-frame region NDA of the display device 1 is provided with the non-rectangular scan drive circuit 51 and the data drive circuit (a data driver) 52. The display control circuit 53 and the power supply circuit 54 may be provided to the picture-frame region NDA of the display device 1 or may be externally added to the display device 1. Note that the non-rectangular scan drive circuit 51 means that the entire outline of the scan drive circuit is not rectangular as illustrated in FIG. 2.

This embodiment exemplifies a case as follows; that is, the scan drive circuit 51, which functions as a scan signal line drive circuit (a gate drive driver), is provided to, for example, the picture-frame region NDA in FIG. 2 on the left, and a not-shown light-emission control circuit (an emission driver) is separated from the scan drive circuit 51 and provided to the picture-frame region NDA in FIG. 2 on the right. However, this embodiment shall not be limited to such an example. The scan signal line drive circuit and the light-emission control circuit may be implemented as a single scan drive circuit 51. In such a case, the scan drive circuit 51 may be provided to only either the picture-frame region NDA on the left or the picture-frame region NDA on the right in FIG. 2. Alternatively, the scan drive circuit 51 may be provided to both of the picture-frame regions NDA.

Furthermore, as illustrated in FIG. 2, this embodiment exemplifies a case where the data drive circuit (the data driver) 52 is provided to the picture-frame region NDA of the display device 1. However, this embodiment shall not be limited to such an example. The data drive circuit 52 may be at least partially provided inside the display region DA.

The power supply circuit 54 generates and supplies: a power supply voltage VA to the scan drive circuit 51; a power supply voltage to a not-shown light-emission control circuit; a power supply voltage VB to the data drive circuit 52; a power supply voltage VC to the display control circuit 53; and multiple kinds of power supply voltages VD to the display region DA; specifically, a high-level power supply voltage ELVDD, a low-level power supply voltage ELVSS, and an initialization voltage Vini.

The display control circuit 53: receives, from outside the display device 1, an input signal including image information representing an image to be displayed and timing control information for displaying the image; generates a scan control signal SIGSC and a data control signal SIGDA in accordance with the input signal; and supplies the scan control signal SIGSC to the scan drive circuit 51 and to a not-shown light-emission control circuit (an emission driver), and the data control signal SIGDA to the data drive circuit 52.

The scan drive circuit 51 includes unit circuits SCn (see FIG. 4) each of which generates a first output signal in accordance with the scan control signal SIGSC, and outputs the first output signal through a first scan signal line (in FIG. 2, only the first scan signal lines NS4 to NS12 are illustrated). Simultaneously, each unit circuit SCn generates a second output signal in accordance with the scan control signal SIGSC, and outputs the second output signal through a second scan signal line (in FIG. 2, only the second scan signal lines PS6 to PS12 are illustrated).

The not-shown light-emission control circuit (the emission driver) generates a light-emission control signal in accordance with the scan control signal SIGSC, and outputs the light-emission control signal through a light-emission control line (in FIG. 2, only the light-emission control lines EM6 to EM12 are illustrated).

The data drive circuit 52 generates a data signal in accordance with the data control signal SIGDA, and outputs the data signal through a data signal line (in FIG. 2, only the data signal lines D1 to D9 are illustrated).

Figure 3:
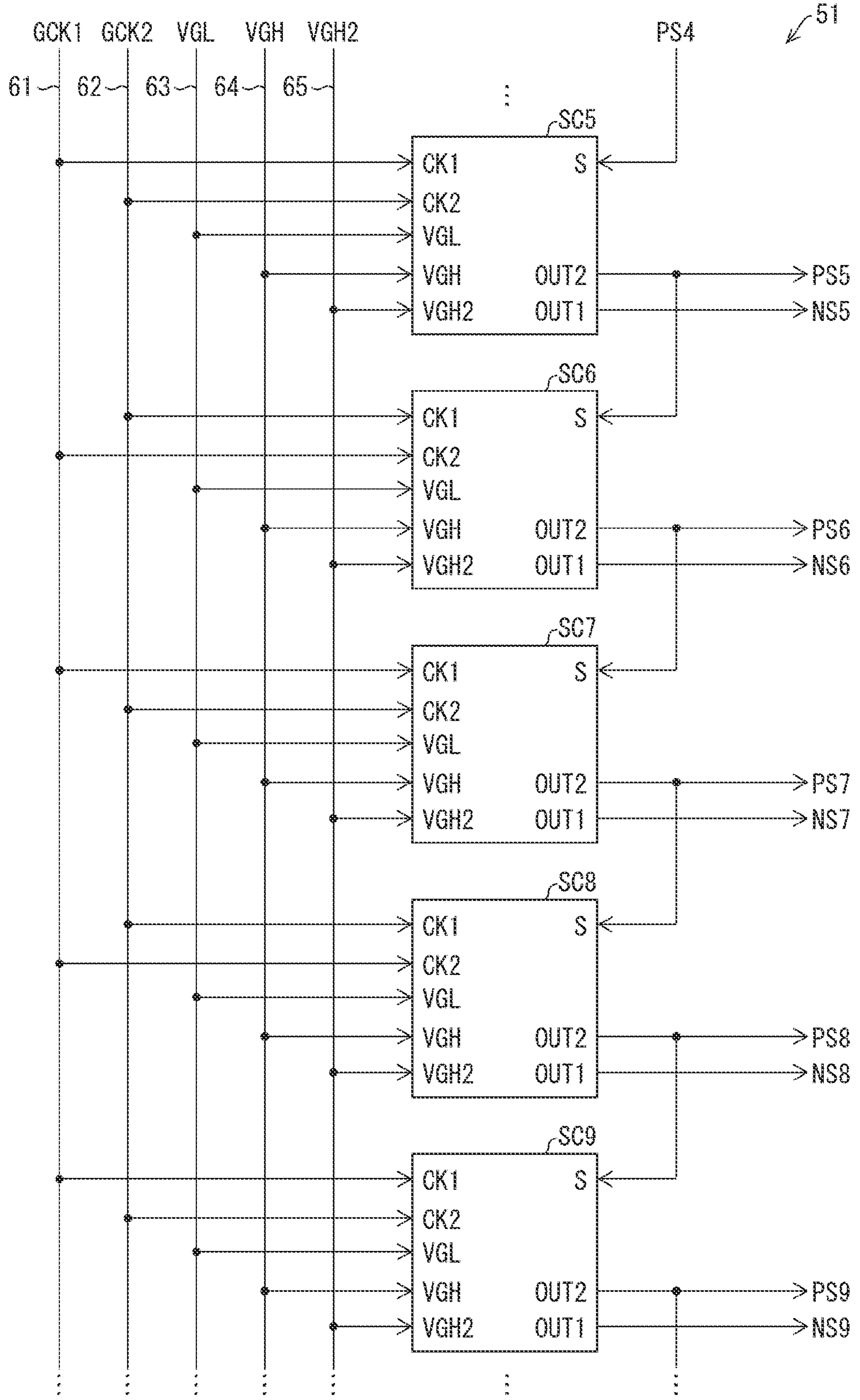
FIG. 3 is a circuit diagram schematically illustrating a configuration of the scan drive circuit included in the display device according to the first embodiment.

FIG. 3 is a circuit diagram schematically illustrating a configuration of the scan drive circuit 51 included in the display device 1.

FIG. 3 illustrates the unit circuits SC5 to SC9 for five stages included in the plurality of unit circuits SCn provided to the scan drive circuit 51.

Each of the unit circuits SC5 to SC9 is supplied with a gate start pulse signal, a first gate clock signal GCK1, and a second gate clock signal GCK2, all of which are included in the scan control signals SIGSC supplied from the display control circuit 53 to the scan drive circuit 51 and serve as signals for controlling the scan signal line drive circuit (the gate drive driver). Simultaneously, each of the unit circuits SC5 to SC9 is supplied with a gate-low voltage VGL, a gate-high voltage VGH, and a control signal VGH2, all of which are power supply voltages VA supplied from the power supply circuit 54 to the scan drive circuit 51. The control signal VGH2 selects between a drive period and a suspension period of the unit circuit SCn.

The picture-frame region NDA of the display device 1 includes: a first gate-clock-signal trunk wire 61 supplied with the first gate clock signal GCK1; a second gate-clock-signal trunk wire 62 supplied with a second gate clock signal GCK2 different from the first gate clock signal GCK1; a first constant-voltage trunk wire 63 supplied with the gate-low voltage VGL; a second constant-voltage trunk wire 64 supplied with the gate-high voltage VGH that is a constant voltage higher than the gate-low voltage VGL; and a control-signal trunk wire 65 supplied with the control signal VGH2. These lines are provided along the picture-frame region NDA.

As illustrated in FIG. 3, each of the plurality of unit circuits SCn (in FIG. 3, only the unit circuits SC5 to SC9 are illustrated) includes: a first input terminal CK1 to which the first gate clock signal GCK1 is input through a branch wire electrically connected to the first gate-clock-signal trunk wire 61; a second input terminal CK2 to which the second gate clock signal GCK2 is input through a branch wire electrically connected to the second gate-clock-signal trunk wire 62; a third input terminal VGL to which the gate-low voltage VGL is input through a branch wire electrically connected to the first constant-voltage trunk wire 63; a fourth input terminal VGH to which the gate-high voltage VGH is input through a branch wire electrically connected to the second constant-voltage trunk wire 64; a fifth input terminal VGH2 to which a control signal VGH2 is input through a branch wire electrically connected to the control-signal trunk wire 65; a sixth input terminal (a set terminal) S to which the second output signal of a unit circuit SCn−1 on the preceding stage is input through a set signal line electrically connected to a second output terminal OUT2 of the unit circuit SCn−1 on the preceding stage; a first output terminal OUT1 that outputs the first output signal generated by the unit circuit SCn to the first scan signal line NSn; and the second output terminal OUT2 that outputs the second output signal generated by the unit circuit SCn to the second scan signal line PSn. Furthermore, although not shown in FIG. 3, a unit circuit included in the plurality of unit circuits SCn in the scan drive circuit 51 and provided to a first stage; namely, a starting stage, has a sixth input terminal (a set terminal) S to which the gate start pulse signal is input.

Figure 4:
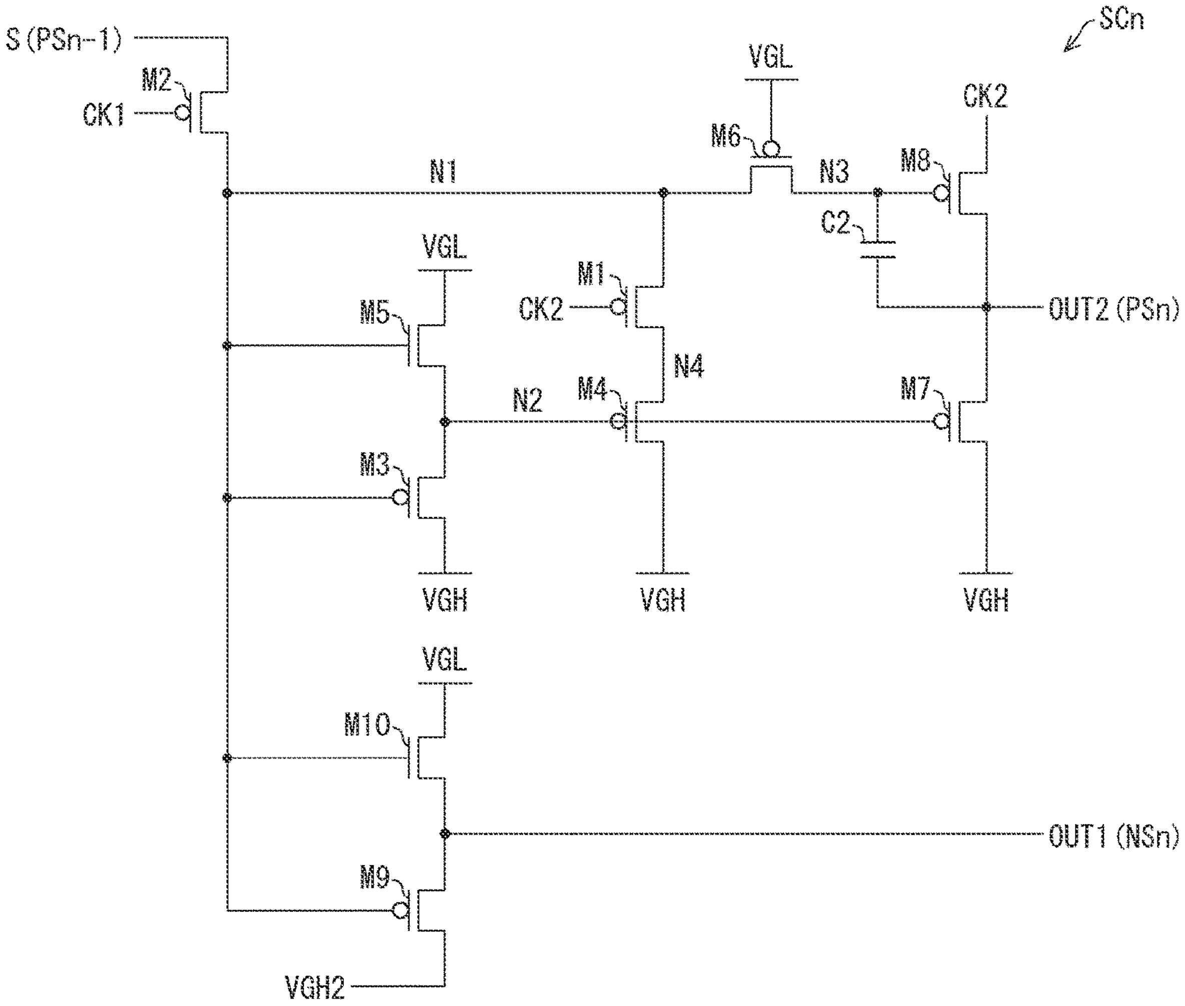
FIG. 4 is a circuit diagram schematically illustrating a configuration of a unit circuit of the scan drive circuit included in the display device according to the first embodiment.

FIG. 4 is a circuit diagram schematically illustrating a configuration of the unit circuit SCn of the scan drive circuit 51 included in the display device 1.

As illustrated in FIG. 4, the unit circuit SCn includes ten transistors M1 to M10 and one capacitor C2. Among these ten transistors M1 to M10, the transistor M5 and the transistor M10 are N-type transistors each including an oxide semiconductor layer. Whereas, the other transistors M1 to M4 and M6 to M9 are P-type transistors each including a polycrystalline silicon layer. Note that the oxide semiconductor layer is preferably a semiconductor layer formed of a compound containing: at least one element selected from the group consisting of indium (In), gallium (Ga), tin (Sn), hafnium (Hf), zirconium (Zr), and zinc (Zn); and oxygen. Note that the configuration of the unit circuit SCn illustrated in FIG. 4 is an example. The configuration of the unit circuit SCn shall not be limited to a particular configuration as long as the unit circuit SCn includes a transistor having an oxide semiconductor layer.

The unit circuit SCn includes: a first control circuit including the transistor M2; a second control circuit including the transistor M3 and the transistor M5; a first output circuit including the transistor M9 and the transistor M10; a second output circuit including the transistor M7 and the transistor M8; and a third control circuit including the transistor M1, the transistor M4, and the transistor M6, and controlling a voltage of a node N1. The transistor M1 and the transistor M4 included in the third control circuit constitute a stabilizing circuit. Note that the transistor M6 serves as an output-circuit control transistor.

As illustrated in FIG. 4, a second conduction terminal (a drain electrode) of the transistor M2, a control terminal (a gate electrode) of the transistor M3, a control terminal (a gate electrode) of the transistor M5, a control terminal (a gate electrode) of the transistor M9, and a control terminal (a gate electrode) of the transistor M10 are electrically connected to one another. Furthermore, the electrically connected second conduction terminal (the drain electrode) of the transistor M2 is electrically connected to a first conduction terminal (a source electrode) of the transistor M1 and to a first conduction terminal (a source electrode) of the transistor M6, and forms the node N1. Moreover, a first conduction terminal (a source electrode) of the transistor M2 is electrically connected to the sixth input terminal (the set terminal) S that inputs the second output signal PSn−1 of the unit circuit SCn−1 on the preceding stage. A control terminal (a gate electrode) of the transistor M2 is electrically connected to the first input terminal CK1. In addition, a first conduction terminal (a source electrode) of the transistor M3 is electrically connected to the fourth input terminal VGH, and a second conduction terminal (a drain electrode) of the transistor M3 is electrically connected to a second conduction terminal (a drain electrode) of the transistor M5. Furthermore, a first conduction terminal (a source electrode) of the transistor M5 is electrically connected to the third input terminal VGL. Moreover, a first conduction terminal (a source electrode) of the transistor M9 is electrically connected to the fifth input terminal VGH2, and a first conduction terminal (a source electrode) of the transistor M10 is electrically connected to the third input terminal VGL. In addition, a second conduction terminal (a drain electrode) of the transistor M9 is electrically connected to a second conduction terminal (a drain electrode) of the transistor M10. The second conduction terminal (the drain electrode) of the transistor M9 and the second conduction terminal (the drain electrode) of the transistor M10 are electrically connected to the first output terminal OUT1, and output the first output signal to the first scan signal line NSn through the first output terminal OUT1.

A control terminal (a gate electrode) of the transistor M1 is electrically connected to the second input terminal CK2, and a second conduction terminal (a drain electrode) of the transistor M1 and a second conduction terminal (a drain electrode) of the transistor M4 are electrically connected together to form a node N4. Moreover, a first conduction terminal (a source electrode) of the transistor M4 is electrically connected to the fourth input terminal VGH, and a control terminal (a gate electrode) of the transistor M4 is electrically connected to the second conduction terminal (the drain electrode) of the transistor M3 and to the second conduction terminal (the drain electrode) of the transistor M5, and forms a node N2.

In addition, a control terminal (a gate electrode) of the transistor M6 is electrically connected to the third input terminal VGL, and a second conduction terminal (a drain electrode) of the transistor M6 is electrically connected to a control terminal (a gate electrode) of the transistor M8 and to one of electrodes of the capacitor C2, and forms a node N3. Furthermore, a first conduction terminal (a source electrode) of the transistor M8 is electrically connected to the second input terminal CK2, a first conduction terminal (a source electrode) of the transistor M7 is electrically connected to the fourth input terminal VGH, and a control terminal (a gate electrode) of the transistor M7 is electrically connected to the control terminal (the gate electrode) of the transistor M4. Moreover, a second conduction terminal (a drain electrode) of the transistor M8, another one of the electrodes of the capacitor C2, and a second conduction terminal (a drain electrode) of the transistor M7 are electrically connected to the second output terminal OUT2, and output the second output signal to the second scan signal line PSn through the second output terminal OUT2.

Figure 5:
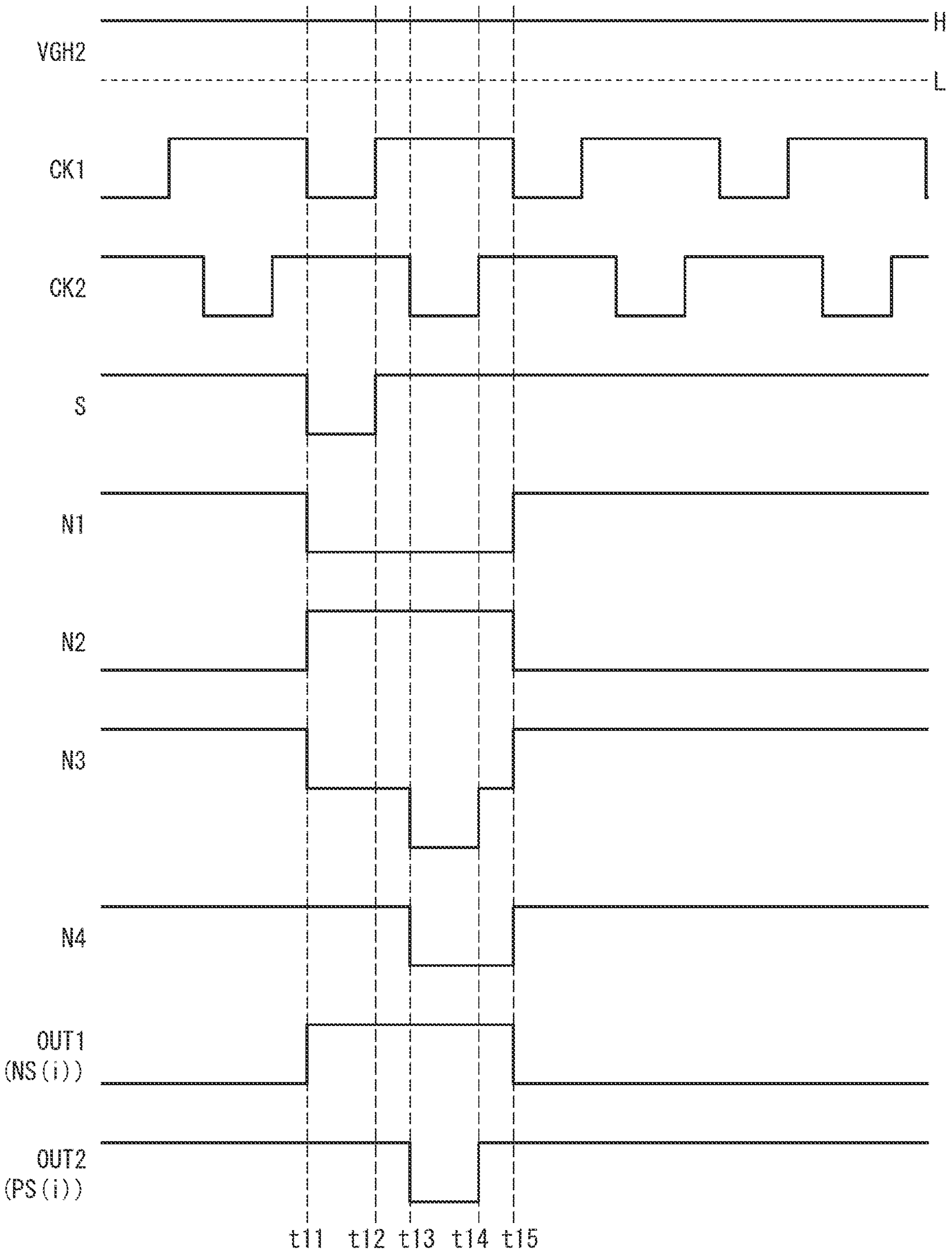
FIG. 5 is a signal waveform diagram showing an operation of the unit circuit in FIG. 4 during a drive period.

FIG. 5 is a signal waveform diagram showing an operation of the unit circuit SCn in FIG. 4 during a drive period.

Described with reference FIG. 5 is an operation of the unit circuit SCn in FIG. 4 during the drive period; that is, an operation of the unit circuit SCn when the control signal VGH2 input from the fifth input terminal VGH2 of the unit circuit SCn is at an H (High) level.

In a period before a time point t11 in FIG. 5, voltages of the node N1 and the node N3 of the unit circuit SCn illustrated in FIG. 4 are maintained at the H level. A voltage of the node N2 of the unit circuit SCn illustrated in FIG. 4 is maintained at an L (Low) level. A first output signal NS(i) (where i=n) output to the first scan signal line NSn through the first output terminal OUT1 is maintained at the L level. A second output signal PS(i) (where i=n) output to the second scan signal line PSn through the second output terminal OUT2 is maintained at the H level. Note that, in the period before the time point t11 in FIG. 5, the node N2 is maintained at the L level, such that the transistor M4 and the transistor M7 are maintained ON.

At the time point t11 in FIG. 5, the first gate clock signal GCK1 input from the first input terminal CK1 of the unit circuit SCn illustrated in FIG. 4 changes from the H level to the L level, and, thus, the transistor M2 turns ON. Furthermore, at the time point t11, the second output signal of the unit circuit SCn−1 on the preceding stage changes from the H level to the L level. Here, the second output signal is input from the sixth input terminal (the set terminal) S of the unit circuit SCn illustrated in FIG. 4. Hence, the voltage of the node N1 falls to the L level, the transistor M3 and the transistor M9 turn ON, and the transistor M5 and the transistor M10 turn OFF. Thus, the voltage of the node N2 changes from the L level to the H level. Moreover, because the transistor M9 is ON, and the control signal VGH2 is at the H level, the first output signal NS(i) output to the first scan signal line NSn through the first output terminal OUT1 changes from the L level to the H level. In addition, even if the voltage of the node N1 falls to the L level, the transistor M6 is maintained ON. Thus, the voltage of the node N3 also falls to the L level. Hence, the transistor M8 turns ON.

At a time point t12 in FIG. 5, the first gate clock signal GCK1 input from the first input terminal CK1 of the unit circuit SCn illustrated in FIG. 4 changes from the L level to the H level. Thus, the transistor M2 turns OFF. Furthermore, at the time point t12, the second output signal of the unit circuit SCn−1 on the preceding stage changes from the L level to the H level. Here, the second output signal is input from the sixth input terminal (the set terminal) S of the unit circuit SCn illustrated in FIG. 4.

At a time point t13 in FIG. 5, the second gate clock signal GCK2 input from the second input terminal CK2 of the unit circuit SCn illustrated in FIG. 4 changes from the H level to the L level. At this time, the transistor M8 is ON, and, as the voltage of the second input terminal CK2 falls, the second output signal PS(i) output to the second scan signal line PSn through the second output terminal OUT2 falls. Here, the capacitor C2 is provided between the node N3 and the second output terminal OUT2. Hence, as the voltage of the second output signal PS(i) output to the second scan signal line PSn through the second output terminal OUT2 falls, the voltage of the node N3 also falls (i.e., the node N3 is in a boost state). As a result, a large negative voltage is applied to the control terminal (the gate electrode) of the transistor M8. Such a bootstrap operation drops the voltage of the second output signal PS(i), which is output to the second scan signal line PSn through the second output terminal OUT2, to a sufficiently low level for the write control transistor T3 (see FIG. 12) to turn ON. As can be seen, when the voltage of the node N3 falls at the time point t13, the voltage of the second conduction terminal (the drain terminal) of the transistor M6 falls below the voltage of the control terminal (the gate terminal) of the transistor M6. Hence, the transistor M6 turns OFF. Thus, at the time point t13, the voltage of the node N1 does not change.

At a time point t14 in FIG. 5, the second gate clock signal GCK2, which is input from the second input terminal CK2 of the unit circuit SCn illustrated in FIG. 4, changes from the L level to the H level. Hence, as the voltage of the second input terminal CK2 rises, the second output signal PS(i) output to the second scan signal line PSn through the second output terminal OUT2 rises. When the voltage of the second output terminal OUT2 rises, the voltage of the node N3 also rises through the capacitor C2. Hence, the transistor M6 turns ON.

At a time point t15 in FIG. 5, the first gate clock signal GCK1, which is input from the first input terminal CK1 of the unit circuit SCn illustrated in FIG. 4, changes from the H level to the L level. Hence, the transistor M2 turns ON. At this time, the second output signal of the unit circuit SCn−1 on the preceding stage is maintained at the H level. Here, the second output signal is input from the sixth input terminal (the set terminal) S of the unit circuit SCn illustrated in FIG. 4. Hence, the voltage of the node N1 rises to the H level, the transistor M3 and the transistor M9 turn OFF, and the transistor M5 and the transistor M10 turn ON. As a result, the first output signal NS(i), which is output to the first scan signal line NSn through the first output terminal OUT1, changes from the H level to the L level. Furthermore, the voltage of the node N2 changes from the H level to the L level. Hence, the transistor M4 and the transistor M7 turn ON. Moreover, because the transistor M6 is maintained ON, the voltage of the node N3 also rises to the H level at the time point 15. Hence, the transistor M8 turns OFF.

In a period after the time point t15 in FIG. 5, as seen in the period before the time point t11 in FIG. 5, the voltages of the node N1 and the node N3 are maintained at the H level. The voltage of the node N2 is maintained at the L level. The first output signal NS(i), which is output to the first scan signal line NSn through the first output terminal OUT1, is maintained at the L level. The second output signal PS(i) which is output to the second scan signal line PSn through the second output terminal OUT2, is maintained at the H level.

The transistors M1 to M10 included in the unit circuit SCn illustrated in FIG. 4 have parasitic capacitances. Hence, in the period before the time point t11 or in the period after the time point t15, the clock operation of the second gate clock signal GCK2 input from the second input terminal CK2 and the parasitic capacitance of the transistor M8 can cause fluctuations in the voltages of the node N1 and the node N3. The voltage fluctuations can cause fluctuations either in the voltage of the first output signal NS(i) output to the first scan signal line NSn through the first output terminal OUT1, or in the voltage of the second output signal PS(i) output to the second scan signal line PSn through the second output terminal OUT2. However, as to the unit circuit SCn illustrated in FIG. 4, the transistor M4 is maintained ON either in the period before the time point t11 in FIG. 5 or in the period after the time point t15 in FIG. 5, and the transistor M1 turns ON each time the second gate clock signal GCK2 input from the second input terminal CK2 changes to the L level. Hence, when both the transistor M1 and the transistor M4 are ON, the node N1 is electrically connected to the fourth input terminal VGH to which the gate-high voltage VGH is input. Thus, either in the period before the time point t11 or in the period after the time point t15, even if the clock operation of the second gate clock signal GCK2 input from the second input terminal CK2 causes noise, the voltages of the node N1 and the node N3 are reliably maintained at the H level.

Whereas, in a period between the time point t11 and the time point t13 in FIG. 5, the second gate clock signal GCK2 input from the second input terminal CK2 is at the H level. Thus, the transistor M1 is maintained OFF. Hence, the voltage of the node N4 maintained at the H level does not affect either the voltage of the node N1 or the voltage of the node N3. Furthermore, at the time point t13 in FIG. 5, the transistor M4 is OFF. Hence, when the second gate clock signal GCK2 input from the second input terminal CK2 changes from the H level to the L level, the voltage of the node N4 also changes from the H level to the L level. After that, as described above, the transistor M4 turns ON at time t15, and, then, the voltage of the node N4 changes from the L level to the H level.

Figure 6:
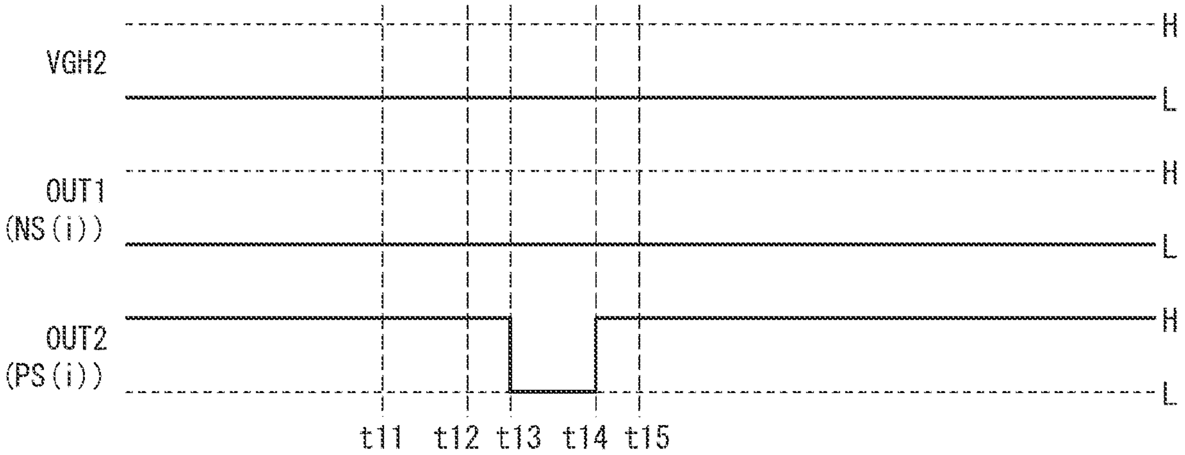
FIG. 6 is a signal waveform diagram showing an operation of the unit circuit in FIG. 4 during a suspension period.

FIG. 6 is a signal waveform diagram showing an operation of the unit circuit SCn in FIG. 4 during a suspension period.

Described with reference FIG. 6 is an operation of the unit circuit SCn in FIG. 4 during the suspension period; that is, an operation of the unit circuit SCn when the control signal VGH2, input from the fifth input terminal VGH2 of the unit circuit SCn, is at the L level.

In a period before the time point t11 in FIG. 6, as seen in FIG. 5, the voltages of the node N1 and the node N3 are maintained at the H level. The voltage of the node N2 is maintained at the L level. The first output signal NS(i), which is output to the first scan signal line NSn through the first output terminal OUT1, is maintained at the L level. The second output signal PS(i), which is output to the second scan signal line PSn through the second output terminal OUT2, is maintained at the H level. Note that the node N2 is maintained at the L level, such that the transistor M7 is maintained ON. The control signal VGH2 is at the H level during the drive period and at the L level during the suspension period. Whereas, the signals to be input to, and the voltages supplied to, the unit circuit SCn except for the control signal VGH2 are the same in both the suspension period and the drive period. Hence, the unit circuit SCn illustrated in FIG. 4, except for the first output circuit including the transistor M9 and the transistor M10 to which the control signal VGH2 is input, operates in a similar manner in the suspension period as in the drive period. As a result, the second output signal PS(i), which is output to the second scan signal line PSn through the second output terminal OUT2 in the suspension period, is the same as the second output signal PS(i) generated in the drive period in FIG. 5. On the other hand, in the suspension period, the control signal VGH2, which is input to the first output circuit including the transistor M9 and the transistor M10, is maintained at the L level. Hence, regardless of the voltage of the node N1 connected to the control terminals of the transistors M9 and M10, the voltages of the second conduction terminals (the drain electrodes) provided to the transistors M9 and M10 and electrically connected together are maintained at the L level. Thus, the first output terminal OUT1 is electrically connected to the second conduction terminals (the drain electrodes) of the transistors M9 and M10, and the first output signal NS(i) output through the first output terminal OUT1 is, as illustrated in FIG. 6, maintained at the L level during the suspension period.

As described above, the unit circuit SCn illustrated in FIG. 4 of this embodiment includes the transistor M6, so that the voltage of the node N1 is maintained when the voltage of the node N3 falls by the bootstrap operation. Hence, compared with a case where no transistor M6 is provided, the amplitude of the voltage decreases at the node N1. Such a feature reduces stress of voltages to be applied to the control terminals (the gate electrodes) of the transistor M3, the transistor M5, and the transistor M9, and stress of voltages to be applied to the first conduction terminal (the source electrode) of the transistor M1 and to the second conduction terminal (the drain electrode) of the transistor M2. As a result, the unit circuit SCn, the scan drive circuit 51 including the unit circuit SCn, and the display device 1 including the scan drive circuit 51 successfully improve in reliability. Furthermore, the unit circuit SCn illustrated in FIG. 4 of this embodiment includes a stabilizing circuit including the transistor M1 and the transistor M4. Thanks to such a feature, the voltages of the node N1 and the node N3 are reliably maintained at the H level even if the clock operation of the second gate clock signal GCK2 input from the second input terminal CK2 generates noise during a period in which the first output signal NS(i) output through the first output terminal OUT1 is maintained at the L level. Consequently, the feature prevents malfunction such as faulty presentation of an image caused by the clock operation of the second gate clock signal GCK2 input from the second input terminal CK2.

Figure 7:
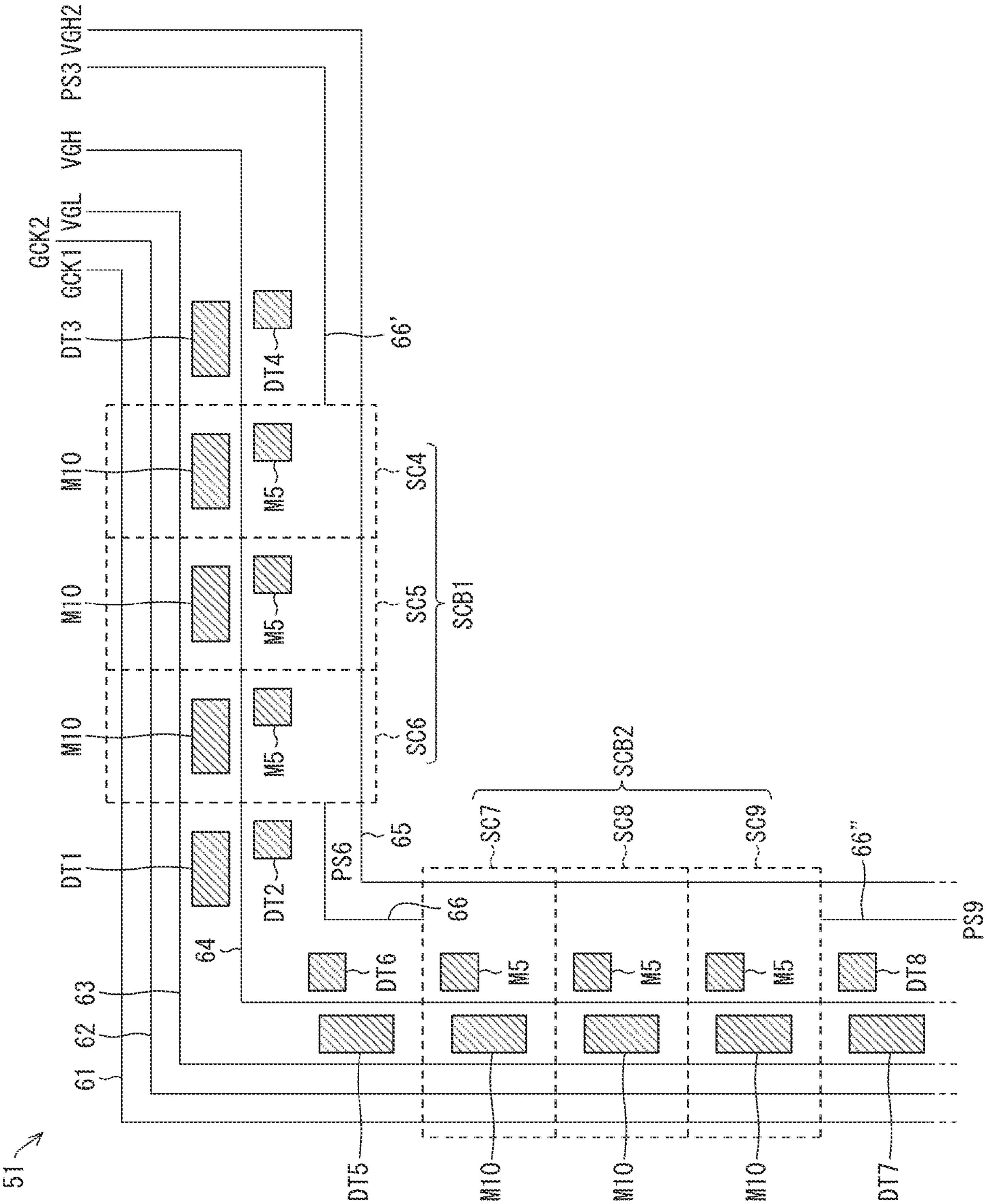
FIG. 7 is a plan view of a portion of the scan drive circuit included in the display device according to the first embodiment.

FIG. 7 is a plan view of a portion of the scan drive circuit 51 included in the display device 1.

As illustrated in FIG. 7, the picture-frame region NDA of the display device 1 includes: the first gate-clock-signal trunk wire 61; the second gate-clock-signal trunk wire 62 supplied with the second gate clock signal GCK2 different from the first gate clock signal GCK1 supplied to the first gate-clock-signal trunk wire 61; the first constant-voltage trunk wire 63; the second constant-voltage trunk wire 64 supplied with a constant voltage higher than a constant voltage supplied to the first constant-voltage trunk wire 63; and the control-signal trunk wire 65 supplied with the control signal VGH2. These lines are provided along the picture-frame region NDA. Then, the picture-frame region NDA includes the unit circuits SCn. Each of the unit circuits SCn is provided with: the transistor M5 (see FIG. 4) including an oxide semiconductor layer, a gate electrode, a source electrode, and a drain electrode; and the transistor M10 (see FIG. 4) including an oxide semiconductor layer, a gate electrode, a source electrode, and a drain electrode. The unit circuit SCn generates the first output signal NS(i) and the second output signal PS(i) and outputs the first output signal NS(i) and the second output signal PS(i) to a subpixel drive circuit (see FIG. 12) of a corresponding subpixel SPIX included in the plurality of subpixels SPIX. The first output signal NS(i) and the second output signal PS(i) are generated and output in accordance with: the first gate clock signal GCK1 from the first gate-clock-signal trunk wire 61; the second gate clock signal GCK2 from the second gate-clock-signal trunk wire 62; the gate-low voltage VGL that is a first constant voltage from the first constant-voltage trunk wire 63; the gate-high voltage VGH that is a second constant voltage from the second constant-voltage trunk wire 64; the control signal VGH2 from the control-signal trunk wire 65; and a set signal PSn−1 from each of the set signal lines 66, 66', and 66".

As illustrated in FIG. 7, a first unit circuit block SCB1 is provided along a section of a region in which the first gate-clock-signal trunk wire 61, the second gate-clock-signal trunk wire 62, the first constant-voltage trunk wire 63, the second constant-voltage trunk wire 64, and the control-signal trunk wire 65 extend. The first unit circuit block SCB1 includes the unit circuits SC4, SC5, and SC6 arranged side by side in a first direction (i.e., one of the left direction or the right direction in the drawing) of a not-shown substrate. Whereas, a second unit circuit block SCB2 is provided along another section of the region in which the first gate-clock-signal trunk wire 61, the second gate-clock-signal trunk wire 62, the first constant-voltage trunk wire 63, the second constant-voltage trunk wire 64, and the control-signal trunk wire 65 extend. The second unit circuit block SCB2 includes the unit circuits SC7, SC8, and SC9 arranged side by side in a second direction (i.e., one of the upward direction or the downward direction in the drawing) of the substrate. The second direction is not in parallel with the first direction.

Although not shown, a second unit circuit block SCB0 may be provided at the upper right of the first unit circuit block SCB1 illustrated in FIG. 7. The second unit circuit block SCB0 may include the unit circuits SC1, SC2, and SC3 arranged side by side in the second direction (i.e., one of the upward direction or the downward direction in the drawing) of the not-shown substrate. Although not shown, a first unit circuit block SCB3 may be provided at the lower left of the second unit circuit block CB2 illustrated in FIG. 7. The first unit circuit block SCB3 may include the unit circuits SC10, SC11, and SC12 arranged side by side in the first direction (i.e., one of the left direction or the right direction in the drawing) of the substrate.

This embodiment exemplifies a case where each of the first unit circuit block SCB1 and the second unit circuit block SCB2 includes three unit circuits SCn. However, this embodiment shall not be limited to such an example. Each of the first unit circuit block SCB1 and the second unit circuit block SCB2 may include a plurality of unit circuits SCn, and the first unit circuit block SCB1 and the second unit circuit block SCB2 may the unit circuits SCn in different numbers.

As illustrated in FIG. 7, a trunk wire forming region is provided between the first unit circuit block SCB1 and the second unit circuit block SCB2. The trunk wire forming region includes: the first gate-clock-signal trunk wire 61; the second gate-clock-signal trunk wire 62; the first constant-voltage trunk wire 63; the second constant-voltage trunk wire 64; and the control-signal trunk wire 65. The trunk wire forming region is provided with the set signal line 66 supplied with a set signal PS6 sent from the unit circuit SC6 included in the plurality of unit circuits SC4 to SC6 in the first unit circuit block SCB1 and provided closest to the second unit circuit block SCB2 to the unit circuit SC7 included in the plurality of unit circuits SC7 to SC9 in the second unit circuit block SCB2 and provided closest to the first unit circuit block SCB1. The trunk wire forming region is provided with four dummy elements DT1, DT2, DT5, and DT6 each including: a second oxide semiconductor layer formed of the same material as a material of a first semiconductor layer included in the transistor M5 and the transistor M10; and a second gate electrode formed of the same material as a material of a first gate electrode included in the transistor M5 and the transistor M10 and overlapping with the second oxide semiconductor layer in plan view.

This embodiment exemplifies a case where the unit circuit SCn of the scan drive circuit 51 includes two transistors (i.e., the transistor M5 and the transistor 10) each including an oxide semiconductor layer. However, this embodiment shall not be limited to such an example. The unit circuit SCn may include one transistor, or three or more transistors each having an oxide semiconductor layer.

Furthermore, this embodiment exemplifies a case where the scan drive circuit 51 includes the four dummy elements DT1, DT2, DT5, and DT6 provided in the trunk wire forming region between the first unit circuit block SCB1 and the second unit circuit block SCB2, and where the dummy element DT1 corresponds to the transistor M10 of the unit circuit SC6, the dummy element DT2 corresponds to the transistor M5 of the unit circuit SC6, the dummy element DT5 corresponds to the transistor M10 of the unit circuit SC7, and the dummy element DT6 corresponds to the transistor M5 of the unit circuit SC7. However, this embodiment shall not be limited to such an example. The scan drive circuit 51 may include one or more of the four dummy elements DT1, DT2, DT5, and DT6.

Furthermore, in the scan drive circuit 51 of this embodiment, layouts of the oxide semiconductor layers are devised not to vary between: a layout around each of the unit circuits SC4 and SC6; and a layout around the unit circuit SC5. Hence, the dummy element DT1 and the transistors M10 included in the first unit circuit block SCB1 most closely adjacent to the dummy element DT1 are provided separated by a distance between two of the transistors M10 adjacent to each other and included in the first unit circuit block SCB1. The dummy element DT2 and the transistors M5 included in the first unit circuit block SCB1 most closely adjacent to the dummy element DT2 are provided separated by a distance between two of the transistors M5 adjacent to each other and included in the first unit circuit block SCB1. The dummy element DT3 and the transistors M10 included in the first unit circuit block SCB1 most closely adjacent to the dummy element DT3 are provided separated by a distance between two of the transistors M10 adjacent to each other and included in the first unit circuit block SCB1. The dummy element DT4 and the transistors M5 included in the first unit circuit block SCB1 most closely adjacent to the dummy element DT4 are provided separated by a distance between two of the transistors M5 adjacent to each other and included in the first unit circuit block SCB1. Moreover, layouts of the oxide semiconductor layers are devised not to vary between: a layout around each of the unit circuits SC7 and SC9; and a layout around the unit circuit SC8. Hence, the dummy element DT5 and the transistors M10 included in the second unit circuit block SCB2 most closely adjacent to the dummy element DT5 are provided separated by a distance between two of the transistors M10 adjacent to each other and included in the second unit circuit block SCB2. The dummy element DT6 and the transistors M5 included in the second unit circuit block SCB2 most closely adjacent to the dummy element DT6 are provided separated by a distance between two of the transistors M5 adjacent to each other and included in the second unit circuit block SCB2. The dummy element DT7 and the transistors M10 included in the second unit circuit block SCB2 most closely adjacent to the dummy element DT2 are provided separated by a distance between two of the transistors M10 adjacent to each other and included in the second unit circuit block SCB2. The dummy element DT8 and the transistor M5 included in the second unit circuit block SCB2 most closely adjacent to the dummy element DT8 are provided separated by a distance between two of the transistors M5 adjacent to each other and included in the second unit circuit block SCB2. The layouts of the oxide semiconductor layers shall not be limited to such layouts. The positions of the dummy elements may be different from either the distance between the two adjacent transistors M10 included in the first unit circuit block SCB1 or in the second unit circuit block SCB2, or the distance between the two adjacent transistors M5 included in the first unit circuit block SCB1 or in the second unit circuit block SCB2.

Note that this embodiment exemplifies a case where, as illustrated in FIG. 7, the first unit circuit block SCB1 has the unit circuit SC4, the unit circuit SC5, and the unit circuit SC6 arranged side by side in the first direction (i.e., one of the left direction or the right direction in the drawing) of the not-shown substrate, and the second unit circuit block SCB2 has the unit circuit SC7, the unit circuit SC8, and the unit circuit SC9 arranged side by side in the second direction (i.e., one of the upward direction or the downward direction in the drawing), of the not-shown substrate, not in parallel with the first direction. However, this embodiment shall not be limited to such an example. The first direction and the second direction only need not to be in parallel with each other. The first direction does not have to be one of the left direction and the right direction in the drawing. The second direction does not have to be one of the upward direction and the downward direction in the drawing.

Note that the set signal line 66' illustrated in FIG. 7 is a wire for supplying a set signal PS3 from the unit circuit SC3, which is a not-shown unit circuit on the preceding stage, to the unit circuit SC4, which is a unit circuit in the following stage. The set signal line 66" illustrated in FIG. 7 is a wire for supplying a set signal PS9 from the unit circuit SC9, which is a unit circuit on the preceding stage, to the unit circuit SC10, which is a not-shown unit circuit in the following stage.

Figure 8:
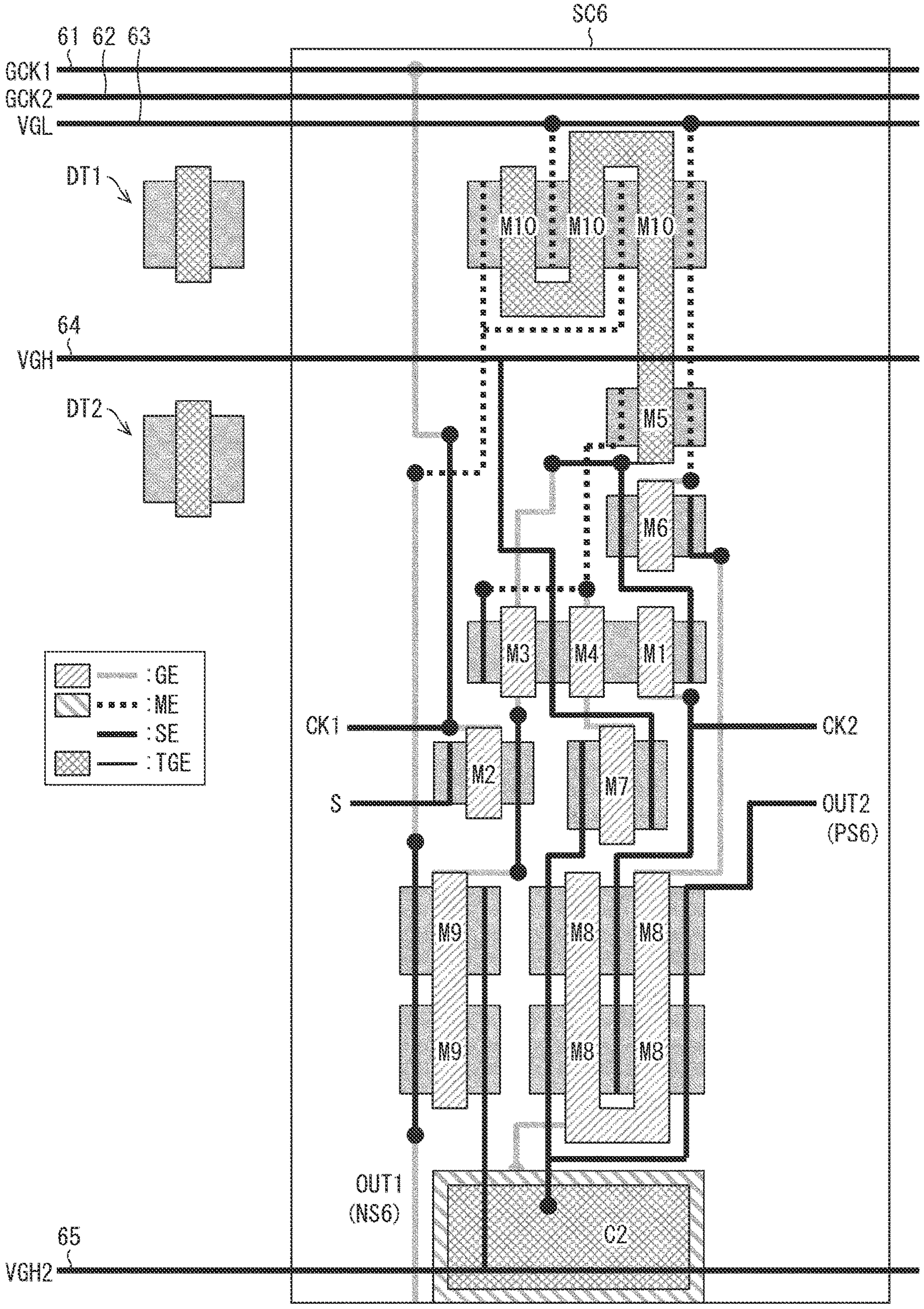
FIG. 8 is a circuit diagram schematically illustrating configurations of dummy elements included in the scan drive circuit of the display device according to the first embodiment.

FIG. 8 is a circuit diagram schematically illustrating configurations of the dummy elements DT1 and DT2 included in the scan drive circuit 51 of the display device 1 according to the first embodiment.

FIG. 8 illustrates the dummy element DT1 and the dummy element DT2 alone provided adjacent to the unit circuit SC6 and respectively corresponding to the transistor M10 and the transistor M5 of the unit circuit SC6. However, the dummy elements shall not be limited to the dummy elements DT1 and DT2. As described above with reference to FIG. 7, the scan drive circuit 51 includes more dummy elements.

Each of the dummy elements DT1 and DT2 includes: the second oxide semiconductor layer formed of the same material as the material of the first oxide semiconductor layer included in each of the transistor M5 and the transistor M10; and the second gate electrode formed of the same material as the material of the first gate electrode included in each of the transistor M5 and the transistor M10 and overlapping with the second oxide semiconductor layer in plan view.

This embodiment exemplifies a case where the second gate electrode of each of the dummy element DT1 and the dummy element DT2 is a floating electrode not electrically connected to any wires including the first gate-clock-signal trunk wire 61, the second gate-clock-signal trunk wire 62, the first constant-voltage trunk wire 63, the second constant-voltage trunk wire 64, and the control-signal trunk wire 65. However, this embodiment shall not be limited to such an example as will be described later with reference to FIGS. 9 and 10.

As illustrated in FIG. 8, the unit circuit SC6; that is, an example of the unit circuit SCn, includes ten transistors M1 to M10 and one capacitor C2. Among these ten transistors M1 to M10, the transistor M5 and the transistor M10 are N-type transistors each including an oxide semiconductor layer. Whereas, the other transistors M1 to M4 and M6 to M9 are P-type transistors each including a polycrystalline silicon layer. Gate electrodes (first gate electrodes) of the transistor M5 and the transistor M10 and gate electrodes (second gate electrodes) of the dummy element DT1 and the dummy element DT2 are formed of the same material; that is, a top-gate electrode layer TGE.

As illustrated in FIG. 8, source electrodes and drain electrodes of the transistor M5 and the transistor M10 are formed of the same material; that is, a first source-drain electrode layer ME. Gate electrodes of the transistors M1 to M4 and M6 to M9 are formed of the same material; that is, a gate electrode layer GE. Source electrodes and drain electrodes of the transistors M1 to M4 and M6 to M9 are formed of the same material; that is, a second source-drain electrode layer SE.

Furthermore, as illustrated in FIG. 8, one of electrodes of the capacitor C2 is formed of the first source-drain electrode layer ME, and another one of the electrodes of the capacitor C2 is formed of the top-gate electrode layer TGE. The first gate-clock-signal trunk wire 61, the second gate-clock-signal trunk wire 62, the first constant-voltage trunk wire 63, the second constant-voltage trunk wire 64, and the control-signal trunk wire 65 are formed of the second source-drain electrode layer SE.

As described above, the scan drive circuit 51 included in the display device 1 is provided with the dummy elements DT1 to DT8 each including an oxide semiconductor layer. Such a feature successfully reduces variation in layouts of the oxide semiconductor layers as to a layout around each of the unit circuit SCn. In particular, the feature successfully reduces fluctuations of the first output signal output from the unit circuit SCn of the scan drive circuit 51 through the first scan signal line NSn, which is caused by the variation in the layouts of the oxide semiconductor layers. Hence, even if the scan drive circuit 51 is non-rectangular; that is, even if the scan drive circuit 51 includes: the first unit circuit block SCB1 having the plurality of unit circuits SCn arranged side by side in the first direction; and the second unit circuit block SCB2 having the plurality of unit circuits SCn arranged side by side in the second direction not in parallel with the first direction, the display device 1 can keep a horizontal line from appearing on an image displayed on the display region DA.

This embodiment exemplifies a case where the scan drive circuit 51 includes the control-signal trunk wire 65 supplied with the control signal VGH2 that selects between the drive period and the suspension period of the unit circuit SCn. However, this embodiment shall not be limited to such an example. For example, if the scan drive circuit does not include the suspension period, the control-signal trunk wire 65 may be supplied with the gate-high voltage VGH instead of the control signal VGH2. Alternatively, the scan drive circuit may omit the control-signal trunk wire 65, and the first conduction terminal (the source electrode) of the transistor M9 illustrated in FIG. 4 may be electrically connected to the fourth input terminal VGH to which the gate-high voltage VGH is input.

Figure 9:
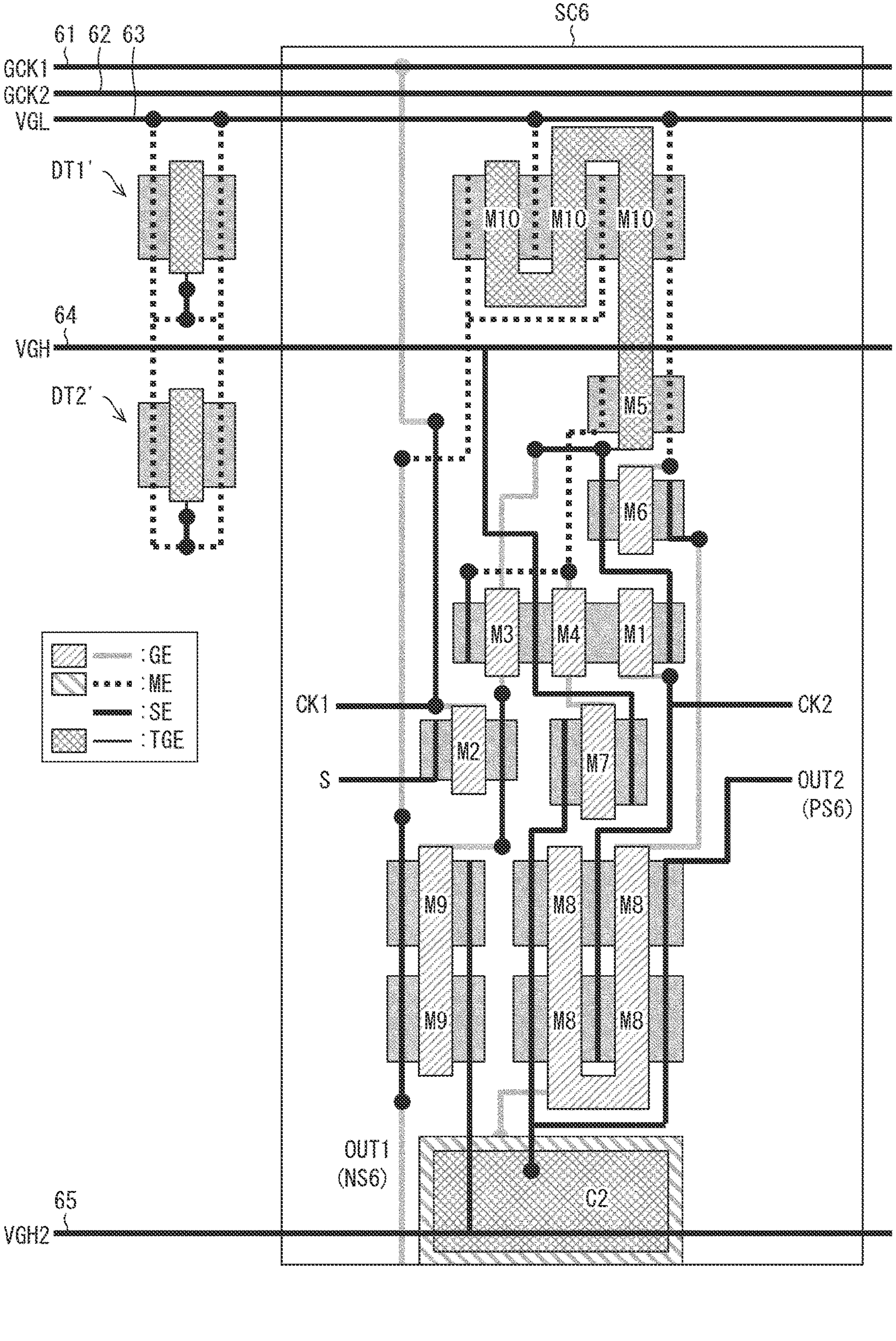
FIG. 9 is a circuit diagram schematically illustrating configurations of dummy transistors; that is, a first modification of the dummy elements in FIG. 8.

FIG. 9 is a circuit diagram schematically illustrating configurations of dummy transistors DT1' and DT2'; that is, a first modification of the dummy elements DT1 and DT2 in FIG. 8.

FIG. 9 illustrates the dummy transistor DT1' and the dummy transistor DT2' alone provided adjacent to the unit circuit SC6 and respectively corresponding to the transistor M10 and the transistor M5 of the unit circuit SC6. However, the dummy transistors shall not be limited to the dummy transistors DT1' and DT2'. As described above with reference to FIG. 7, the scan drive circuit 51 includes more dummy transistors.

Each of the dummy transistors DT1' and DT2' includes: the second oxide semiconductor layer formed of the same material as the material of the first oxide semiconductor layer included in each of the transistor M5 and the transistor M10; and the second gate electrode formed of the same material as the material of the first gate electrode included in each of the transistor M5 and the transistor M10 and overlapping with the second oxide semiconductor layer in plan view. Each of the dummy transistors DT1' and DT2' further includes: a second source electrode formed of the same material as a material of the first source electrode included in each of the transistor M5 and the transistor M10; and a second drain electrode formed of the same material as a material of the first drain electrode included in each of the transistor M5 and the transistor M10. The second gate electrode, the second source electrode, and the second drain electrode are electrically connected to the first constant-voltage trunk wire 63.

In this embodiment, as illustrated in FIG. 9, the second source electrode and the second drain electrode of the dummy transistor DT1' and the second source electrode and the second drain electrode of the dummy transistor DT2' are formed of the first source-drain electrode layer ME electrically connected to the first constant-voltage trunk wire 63. The second gate electrode of the dummy transistor DT1' and the second gate electrode of the dummy transistor DT2' are electrically connected, through contact holes represented by black dots in the drawing and the second source-drain electrode layer SE, to the first source-drain electrode layer ME electrically connected to the first constant-voltage trunk wire 63.

As illustrated in FIG. 9, the gate electrodes (the first gate electrodes) of the transistor M5 and the transistor M10 and gate electrodes (second gate electrodes) of the dummy transistor DT1' and the dummy transistor DT2' are formed of the same material; that is, the top-gate electrode layer TGE. Furthermore, the source electrodes (the first source electrodes) and the drain electrodes (the first drain electrodes) of the transistor M5 and the transistor M10 and source electrodes (second source electrodes) of and drain electrodes (second drain electrodes) of the dummy transistor DT1' and the dummy transistor DT2' are formed of the same material; that is, the first source-drain electrode layer ME.

As described above, if the scan drive circuit 51 includes the dummy transistors DT1' and DT2', such a feature successfully reduces variation in layouts of the oxide semiconductor layers as to a layout around each of the unit circuit SCn. In particular, the feature can reduce fluctuations of the first output signal output from the unit circuit SCn of the scan drive circuit 51 through the first scan signal line NSn, which is caused by the variation in the layouts of the oxide semiconductor layers. Hence, even if the scan drive circuit 51 is non-rectangular; that is, even if the scan drive circuit 51 includes: the first unit circuit block SCB1 having the plurality of unit circuits SCn arranged side by side in the first direction; and the second unit circuit block SCB2 having the plurality of unit circuits SCn arranged side by side in the second direction not in parallel with the first direction, the display device can keep a horizontal line from appearing on an image displayed on the display region DA.

Figure 10:
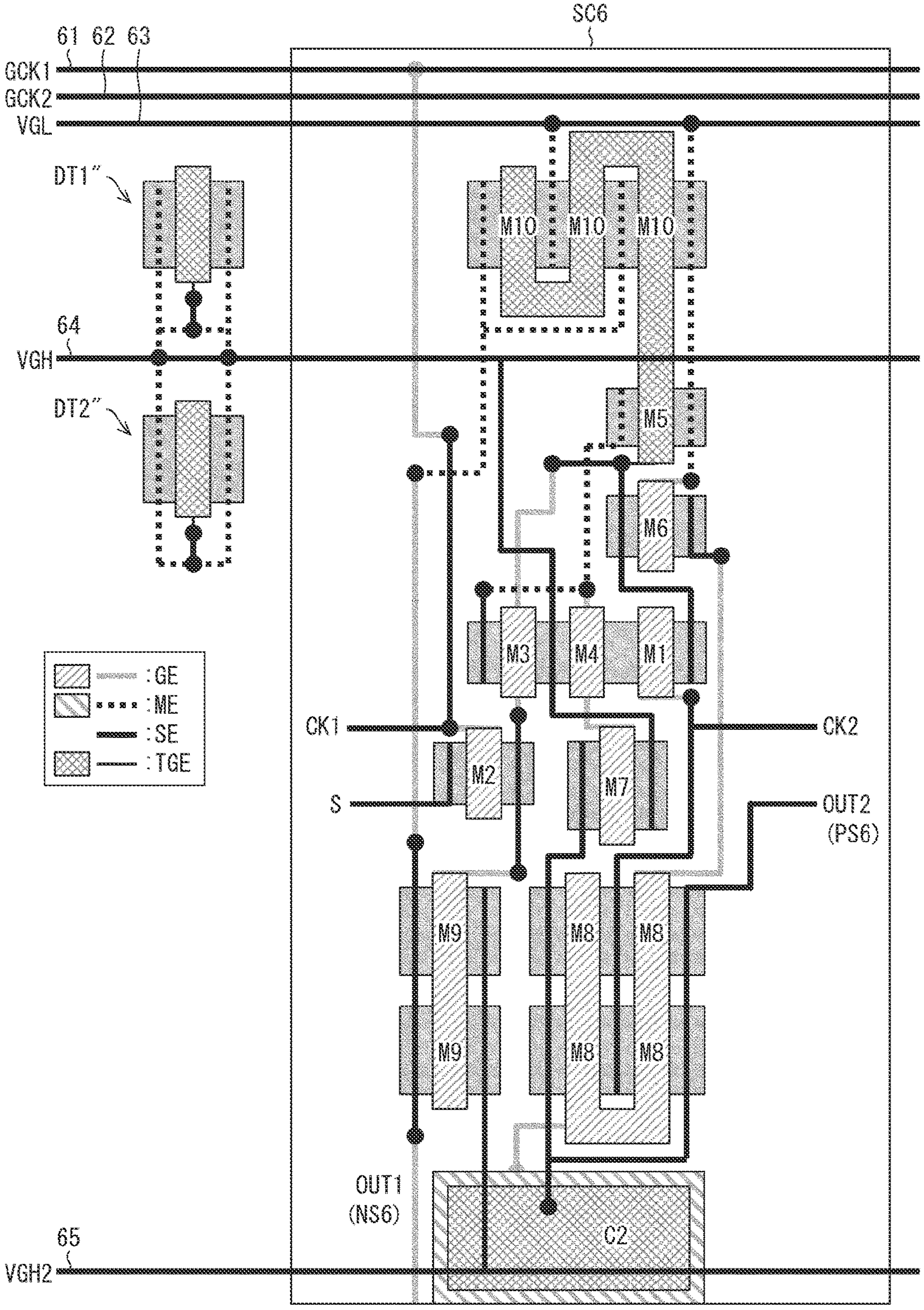
FIG. 10 is a circuit diagram schematically illustrating configurations of dummy transistors; that is, a second modification of the dummy elements in FIG. 8.

FIG. 10 is a circuit diagram schematically illustrating configurations of dummy transistors DT1" and DT2"; that is, a second modification of the dummy elements DT1 and DT2 in FIG. 8.

FIG. 10 illustrates the dummy transistor DT1" and the dummy transistor DT2" alone provided adjacent to the unit circuit SC6 and respectively corresponding to the transistor M10 and the transistor M5 of the unit circuit SC6. However, the dummy transistors shall not be limited to the dummy transistors DT1" and DT2". As described above with reference to FIG. 7, the scan drive circuit 51 includes more dummy transistors.

Each of the dummy transistors DT1" and DT2" includes: the second oxide semiconductor layer formed of the same material as the material of the first oxide semiconductor layer included in each of the transistor M5 and the transistor M10; and the second gate electrode formed of the same material as the material of the first gate electrode included in each of the transistor M5 and the transistor M10 and overlapping with the second oxide semiconductor layer in plan view. Each of the dummy transistors DT1" and DT2" further includes: a second source electrode formed of the same material as a material of the first source electrode included in each of the transistor M5 and the transistor M10; and a second drain electrode formed of the same material as a material of the first drain electrode included in each of the transistor M5 and the transistor M10. The second gate electrode, the second source electrode, and the second drain electrode are electrically connected to the second constant-voltage trunk wire 64.

In this embodiment, as illustrated in FIG. 10, the second source electrode and the second drain electrode of the dummy transistor DT1" and the second source electrode and the second drain electrode of the dummy transistor DT2" are formed of the first source-drain electrode layer ME electrically connected to the second constant-voltage trunk wire 64. The second gate electrode of the dummy transistor DT1" and the second gate electrode of the dummy transistor DT2" are electrically connected, through contact holes represented by black dots in the drawing and the second source-drain electrode layer SE, to the first source-drain electrode layer ME electrically connected to the second constant-voltage trunk wire 64.

As illustrated in FIG. 10, the gate electrodes (the first gate electrodes) of the transistor M5 and the transistor M10 and gate electrodes (second gate electrodes) of the dummy transistor DT1" and the dummy transistor DT2" are formed of the same material; that is, the top-gate electrode layer TGE. Furthermore, the source electrodes (the first source electrodes) and the drain electrodes (the first drain electrodes) of the transistor M5 and the transistor M10 and source electrodes (second source electrodes) and drain electrodes (second drain electrodes) of the dummy transistor DT1" and the dummy transistor DT2" are formed of the same material; that is, the first source-drain electrode layer ME.

As described above, if the scan drive circuit 51 includes the dummy transistors DT1" and DT2", such a feature successfully reduces variation in layouts of the oxide semiconductor layers as to a layout around each of the unit circuit SCn. In particular, the feature successfully reduces fluctuations of the first output signal output from the unit circuit SCn of the scan drive circuit 51 through the first scan signal line NSn, which is caused by the variation in the layouts of the oxide semiconductor layers. Hence, even if the scan drive circuit 51 is non-rectangular; that is, even if the scan drive circuit 51 includes: the first unit circuit block SCB1 having the plurality of unit circuits SCn arranged side by side in the first direction; and the second unit circuit block SCB2 having the plurality of unit circuits SCn arranged side by side in the second direction not in parallel with the first direction, the display device can keep a horizontal line from appearing on an image displayed on the display region DA.

Figure 11:
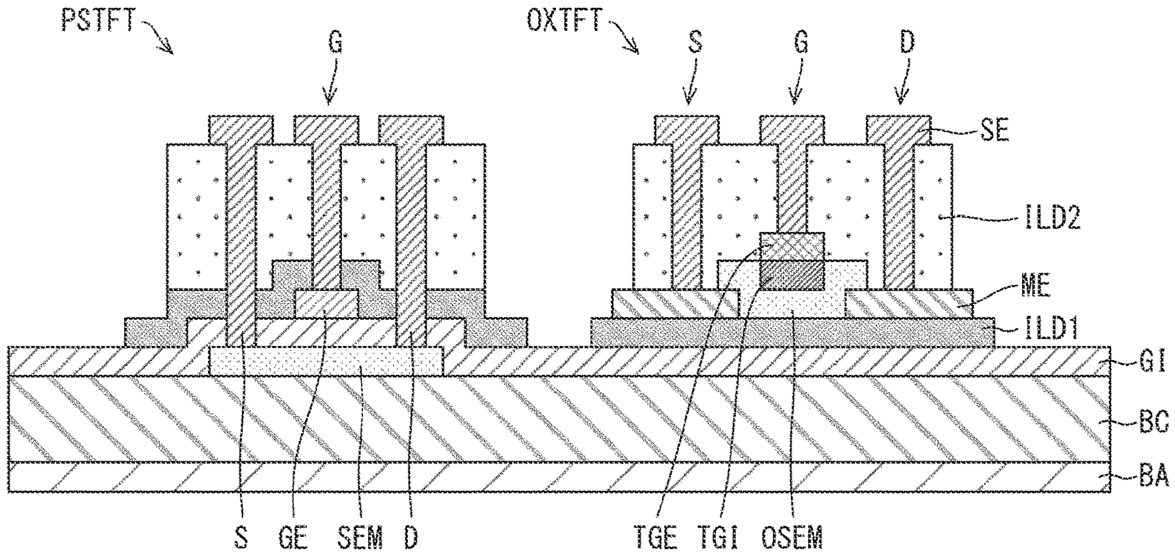
FIG. 11 is a cross-sectional view schematically illustrating configurations of transistors included in the display device of the first embodiment. One of the transistors includes an oxide semiconductor layer, and another one of the transistors includes a polycrystalline silicon layer.

FIG. 11 is a cross-sectional view schematically illustrating configurations of a transistor OXTFT and a transistor PSTFT both included in the display device 1. The transistor OXTFT includes an oxide semiconductor layer OSEM, and the transistor PSTFT includes a polycrystalline silicon layer SEM.

As described above, the unit circuit SCn is included in the scan drive circuit 51 provided to the picture-frame region NDA of the display device 1. The SCn includes ten transistors M1 to M10. Among these ten transistors M1 to M10, the transistor M5 and the transistor M10 are N-type transistors; that is, transistors OXTFT each including the oxide semiconductor layer OSEM. The other transistors M1 to M4 and M6 to M9 are P-type transistors; that is; transistors PSTFT each including the polycrystalline silicon layer SEM.

As will be described later, each of the subpixels SPIX in the display region DA of the display device 1 includes a subpixel drive circuit (see FIG. 12). This embodiment exemplifies a case where, similar to the unit circuit SCn, the subpixel drive circuit also includes the transistors OXTFT each including the oxide semiconductor layer OSEM and the transistors PSTFT each including the polycrystalline silicon layer SEM. However, this embodiment shall not be limited to such an example.

This embodiment exemplifies a case where, as illustrated in FIG. 11, the transistor OXTFT including the oxide semiconductor layer OSEM and the transistor PSTFT including the polycrystalline silicon layer SEM are provided on a barrier layer BC provided to a substrate BA. However, this embodiment shall not be limited to such an example. The barrier layer BC may be omitted as appropriate.

The substrate BA may be, for example, either a resin substrate made of a resin material such as polyimide, or a glass substrate. This embodiment exemplifies a case where the display device 1 is a flexible display device, and the substrate BA is a resin substrate made of a resin material such as polyimide. However, this embodiment shall not be limited to such an example. If the display device 1 is a non-flexible display device, the substrate BA may be a glass substrate.

The barrier layer BC is a layer that prevents foreign substances such as water and oxygen from entering the transistors and the light-emitting elements. The barrier layer BC may be a silicon oxide film, a silicon nitride film, or a silicon oxynitride film formed by the CVD. Alternatively, the barrier layer BC may be a multilayer film including these films.

In this embodiment, the production steps below are carried out to form, on the substrate BA, the transistor OXTFT including the oxide semiconductor layer OSEM and the transistor PSTFT including the polycrystalline silicon layer SEM. First, on the barrier layer BC, the polycrystalline silicon layer SEM is formed to have a predetermined shape to serve as a semiconductor layer of the transistor PSTFT. After that, a gate insulating layer GI is formed on the entire surface of the polycrystalline silicon layer SEM. After that, on the gate insulating layer GI, a gate electrode layer GE is formed to have a predetermined shape to serve as a portion of a gate electrode G of the transistor PSTFT. Then, a first interlayer insulating film ILD1 is formed. After that, the first source-drain electrode layer ME is formed to have a predetermined shape to serve as portions of a source electrode S and a drain electrode D of the transistor OXTFT. Then, the oxide semiconductor layer OSEM is formed to have a predetermined shape to serve as a semiconductor layer of the transistor OXTFT. After that, a portion of the oxide semiconductor layer OSEM is removed by dry etching. A top-gate insulating film TGI is formed to fill in the removed portion. After that, the top-gate electrode layer TGE is formed to have a predetermined shape to serve as a portion of the gate electrodes G of the transistors OXTFT. Then, a second interlayer insulating film ILD2 is formed. Then, as illustrated in FIG. 11, a plurality of contact holes are formed, and the second source-drain electrode layer SE is formed to have a predetermined shape. The second source-drain electrode layer SE serves as portions of the gate electrodes G, the source electrodes S, and the drain electrodes D of the transistor PSTFT and the transistor OXTFT.

The above steps to form, on the substrate BA, the transistor OXTFT including the oxide semiconductor layer OSEM and the transistor PSTFT including the polycrystalline silicon layer SEM are an example. The steps shall not be limited to such an example.

Figure 12:
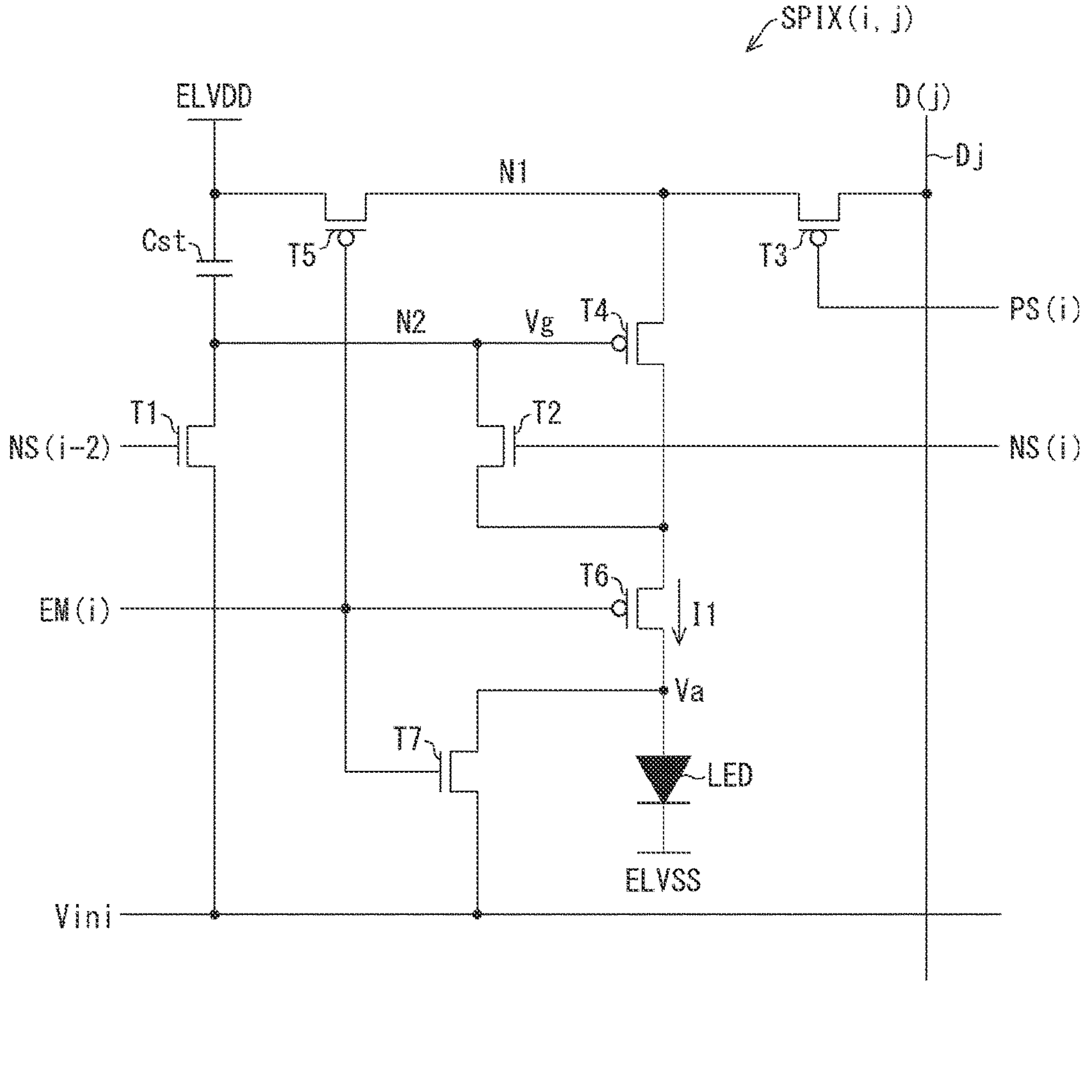
FIG. 12 is a circuit diagram schematically illustrating a configuration of a subpixel drive circuit provided for each of the subpixels in the display device according to the first embodiment.

FIG. 12 is a circuit diagram schematically illustrating a configuration of a subpixel drive circuit provided for each of the subpixels SPIX in the display device 1.

FIG. 12 schematically illustrates a configuration of a subpixel drive circuit provided to a subpixel SPIX (i,j) in the display device 1. Here, i and j are natural numbers. If i is 1, an NS(−1) signal is supplied from the unit circuit SC (−1) and input to a gate electrode of a transistor T1. If i is 2, an NS(0) signal is supplied from the unit circuit SC(0) and input to the gate electrode of the transistor T1. Among the plurality of unit circuits SCn provided to the scan drive circuit 51, the unit circuit on the first stage; namely, the starting stage, is the unit circuit SC (−1), the unit circuit on the second stage is the unit circuit SC(0), and the unit circuits on the third stage to the n-th stage are the unit circuits SC1 to SCn. Note that the unit circuit SC (−1) on the first stage; namely, the starting stage, has the sixth input terminal (the set terminal) S to which the gate start pulse signal is input.

As illustrated in FIG. 12, the subpixel drive circuit includes: one organic light-emitting diode (OLED), or one quantum-dot light-emitting diode (QLED), serving as a light-emitting element LED; seven transistors T1 to T7; and one holding capacitor Cst. The transistor T1 is a first initialization transistor. The transistor T2 is a threshold compensation transistor. The transistor T3 is a write control transistor. The transistor T4 is a drive transistor. The transistor T5 is a first light-emission control transistor. The transistor T6 is a second light-emission control transistor. The transistor T7 is a second initialization transistor.

The transistor T1, the transistor T2, and the transistor T7 are N-type transistors each of which is a transistor OXTFT including an oxide semiconductor layer OSEM. Whereas, the other transistors T3 to T6 are P-type transistors each of which is a transistor PSTFT including a polycrystalline silicon layer. Note that, except for the transistor T4 serving as a drive transistor, the transistors T1 to T3 and the transistors T5 to T7 function as switch elements.

As can be seen, this embodiment exemplifies a case where, one subpixel drive circuit includes: the transistors OXTFT each including the oxide semiconductor layer OSEM; and the transistors PSTFT including the polycrystalline silicon layer SEM. However, this embodiment shall not be limited to such an example. One subpixel drive circuit may include either the transistor OXTFT alone, or the transistor PSTFT alone.

The first output signal NS(i) input to a gate electrode of the transistor T2 is a first output signal output from the unit circuit SCn of the scan drive circuit 51. The first output signal NS(i) is supplied through the first scan signal line NSn. Furthermore, the second output signal PS(i) input to a gate electrode of the transistor T3 is a second output signal output from the unit circuit SCn of the scan drive circuit 51. The second output signal PS(i) is supplied through the second scan signal line PSn. Moreover, a light-emission control output signal EM(i) input to a gate electrode of the transistor T6 is a signal output from the light-emission control circuit (the emission driver). The light-emission control output signal EM(i) is supplied through a light-emission control line EMn. In addition, the high-level power supply voltage ELVDD is supplied from the power supply circuit 54 through a high-level power supply line. The low-level power supply voltage ELVSS is supplied from the power supply circuit 54 through a low-level power supply line. The initialization voltage Vini is supplied from the power supply circuit 54 through an initialization voltage line. Furthermore, a data signal D(j) is a signal output from the data drive circuit 52 and input to a source electrode of the transistor T3. The data signal D(j) is supplied through a data signal line Dj.

As illustrated in FIG. 12, the gate electrode of the transistor T1 is electrically connected to a first scan signal line NSn−2 that is two lines before, and receives an NS(i−2) signal. A drain electrode of the transistor T1 is connected to one of electrodes of the holding capacitor Cst, to a gate electrode of the transistor T4, and to a source electrode of the transistor T2. A source electrode of the transistor T1 is electrically connected to the initialization voltage line supplied with the initialization voltage Vini. The gate electrode of the transistor T2 is connected to the first scan signal line NSn supplied with the first output signal NS(i). A drain electrode of the transistor T2 is electrically connected to a drain electrode of the transistor T4, and to a source electrode of the transistor T6. The source electrode of the transistor T2 is electrically connected to the gate electrode of the transistor T4. The gate electrode of the transistor T3 is electrically connected to the second scan signal line PSn supplied with the second output signal PS(i). The source electrode of the transistor T3 is electrically connected to the data signal line Dj supplied with the data signal D(j). A drain electrode of the transistor T3 is electrically connected to a source electrode of the transistor T4, and to a drain electrode of the transistor T5. The gate electrode of the transistor T4 is electrically connected to the one electrode of the holding capacitor Cst, and to the source electrode of the transistor T2. The source electrode of the transistor T4 is connected to the drain electrode of the transistor T3 and to the drain electrode of the transistor T5. The drain electrode of the transistor T4 is electrically connected to the source electrode of the transistor T6. A gate electrode of the transistor T5 is electrically connected to the light-emission control line EMn supplied with the light-emission control signal EM(i). A source electrode of the transistor T5 is electrically connected to the high-level power supply line supplied with the high-level power supply voltage ELVDD. The drain electrode of the transistor T5 is electrically connected to the drain electrode of the transistor T3, and to the source electrode of the transistor T4. The gate electrode of the transistor T6 is electrically connected to the light-emission control line EMn supplied with the light-emission control signal EM(i). The source electrode of the transistor T6 is electrically connected to the drain electrode of the transistor T4. A drain electrode of the transistor T6 is electrically connected to an anode electrode of the light-emitting element LED. A gate electrode of the transistor T7 is electrically connected to the light-emission control line EMn supplied with the light-emission control signal EM(i). A source electrode of the transistor T7 is electrically connected to the initialization voltage line supplied with the initialization voltage Vini. A drain electrode of the transistor T7 is electrically connected to the anode electrode of the light-emitting element LED. Another one of the electrodes of the holding capacitor Cst is electrically connected to the high-level power supply line supplied with the high-level power supply voltage ELVDD. A cathode electrode of the light-emitting element LED is electrically connected to the low-level power supply line supplied with the low-level power supply voltage ELVSS. Note that the NS(i−2) signal input to the gate electrode of the transistor T1 may be an NS(i−1) signal. In this case, the gate electrode of the transistor T1 is electrically connected to the first scan signal line NSn−1 that is one line before. Note that the source electrode of the transistor T4, the drain electrode of the transistor T3, and the drain electrode of the transistor T5 are electrically connected together to form the node N1. The source electrode of the transistor T2, the gate electrode of the transistor T4, the drain electrode of the transistor T1, and the one electrode of the holding capacitor Cst are electrically connected together to form the node N2.

Figure 13:
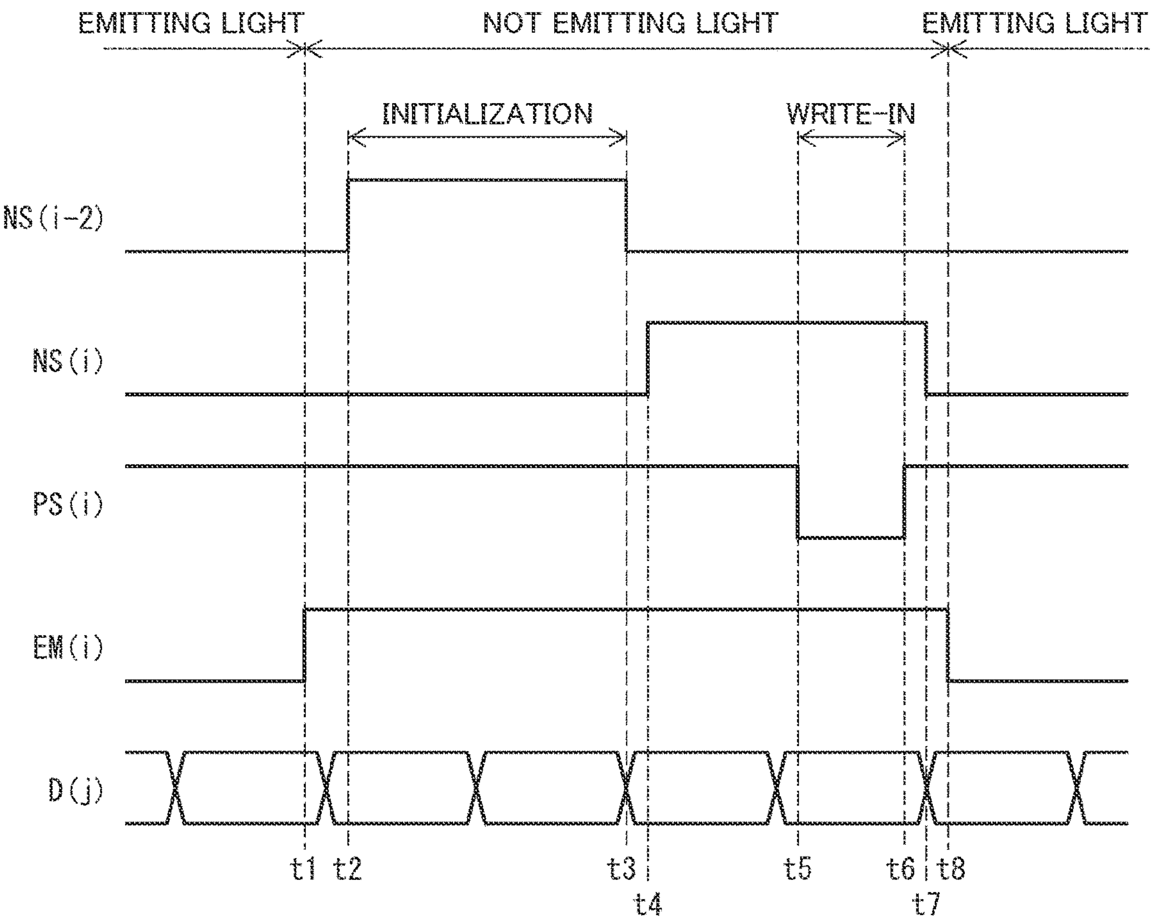
FIG. 13 is a timing diagram showing an operation of the subpixel drive circuit during a non-light-emitting period included in a drive period of the scan drive circuit included in the display device according to the first embodiment.

FIG. 13 is a timing diagram showing an operation of a subpixel drive circuit during a non-light-emitting period included in a drive period of the scan drive circuit 51.

As illustrated in FIG. 13, when the light-emission control signal EM(i) changes from the L level to the H level at a time point t1, the P-type transistor T5 and the P-type transistor T6 change from ON to OFF. While the light-emission control signal EM(i) is at the H level, the transistors T5 and T6 remain OFF. Hence, in the period t1 to t8 in which the light-emission control signal EM(i) is at the H level, no current flows through the light-emitting element LED, and the subpixel SPIX (i,j) is in the non-light-emitting state. Furthermore, in the period t1 to t8 in which the subpixel SPIX (i,j) is in the non-light-emitting state (i.e., in the non-light-emitting period), the N-type transistor T7 turns ON. Hence, the initialization voltage Vini is supplied, and a voltage Va of the anode electrode of the light-emitting element LED is initialized. In the non-light-emitting period t1 to t8, the NS(i−2) signal supplied to the gate electrode of the transistor T1 changes from the L level to the H level at the time point t2. Thus, the N-type transistor T1 changes from OFF to ON, and remains ON while the NS(i−2) signal is at the H level. A period t2 to t3 in which the transistor T1 is ON is an initialization period. In the initialization period, the holding capacitor Cst is initialized, so that a voltage Vg of the gate electrode of the transistor T4 becomes the initialization voltage Vini.

Moreover, as shown in FIG. 13, the NS(i−2) signal changes to the L level at the time point t3. After that, the first output signal NS(i) changes from the L level to the H level at the time point t4. Hence, the N-type transistor T2 changes from OFF to ON, and remains ON while the first output signal NS(i) is at the H level. The transistor T4 remains connected to the diode. In a period t4 to t7 in which the transistor T2 is ON, the second output signal PS(i) changes from the H level to the L level at the time point t5. Hence, the P-type transistor T3 changes from OFF to ON, and remains ON while the second output signal PS(i) is at the L level. A period t5 to t6 in which the transistor T3 is ON is a data write period. A voltage of the data signal D(j) is provided as a data voltage Vdata to the holding capacitor Cst through the transistor T4 on connection to the diode. As a result, the data voltage Vdata is written to, and held in, the holding capacitor Cst, and the voltage (the gate voltage) Vg of the gate electrode of the transistor T4 is maintained as a voltage of the one electrode of the holding capacitor Cst. At the time period t7 after the data write period t5 to t6, the first output signal PS(i) changes from the H level to the L level, and the transistor T2 turns OFF. Then, at the time period t8, the light-emission control signal EM(i) changes from the H level to the L level, and the transistor T5 and the transistor T6 turn ON. Thus, the light-emitting period starts.

Figure 14:
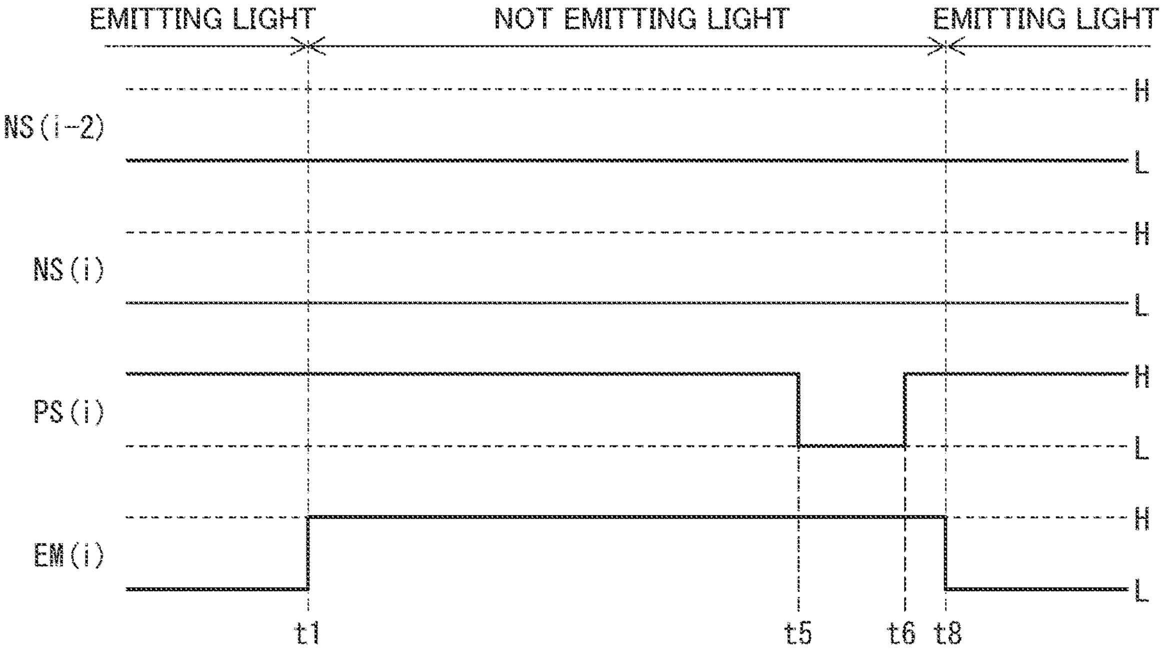
FIG. 14 is a timing diagram showing an operation of the subpixel drive circuit during a suspension period of the scan drive circuit included in the display device according to the first embodiment.

FIG. 14 is a timing diagram showing an operation of the subpixel drive circuit during a suspension period of the scan drive circuit 51.

FIG. 14 shows that, in the suspension period of the scan drive circuit 51, the light-emission control signal EM(i) and the second output signal PS(i) are generated and supplied in the same manner as in the drive period of the scan drive circuit 51. Whereas, in the suspension period of the scan drive circuit 51, neither the first output signal NS(i−2) nor the first output signal NS(i) is generated. Hence, the light-emission control signal EM(i) changes from the L level to the H level at the time point t1 when the non-light-emitting period starts, and changes from the H level to the L level at the time point t8 when the non-light-emitting period ends. Whereas, in the non-light-emitting period, the second output signal PS(i) also changes from the H level to the L level at the time point t5, and changes from the L level to the H level at the time point t6. Thus, in the period t5 to t6 in which the second output signal PS(i) is at the L level (i.e., the second output signal PS(i) is active), the transistor T3 is ON, and, through the transistor T3, the voltage of the data signal D(j) is provided to the source electrode of the transistor T4. In this embodiment, in the suspension period of the scan drive circuit 51, the data signal D(j) output from the data drive circuit 52 is an ON-bias voltage Vob. Thus, in the period t5 to t6 in which the second output signal PS(i) is at the L level, the ON-bias voltage Vob is applied to the source electrode of the transistor T4. The applied ON-bias voltage Vob is held on the source electrode of the transistor T4 until the time point t8 at which the light-emission control signal EM(i) changes to the L level. Hence, the source electrode of the transistor T4 is supplied with the ON-bias voltage Vob substantially in a period between the time point t5 and the time point t8 as shown in FIG. 14. In the suspension period of the scan drive circuit 51, the ON-bias voltage Vob output from the data drive circuit 52 is appropriately set, thereby successfully reducing a shift in threshold value caused by hysteresis characteristics due to difference in stress of a voltage applied to the transistor T4 in the non-light-emitting period.

Second Embodiment

Described next is a second embodiment of the disclosure, with reference to FIG. 15. A scan drive circuit 51*a* included in a display device of this embodiment differs from the scan drive circuit 51 of the first embodiment in that distances DIS1 and DIS1' between the set signal lines 66*a*, 66*a*', and 66*a*" and the control-signal trunk wire 65 are greater than distances DIS2 and DIS2' between the first gate-clock-signal trunk wire 61 and the second gate-clock-signal trunk wire 62. Otherwise, the scan drive circuit 51*a* is the same as the scan drive circuit 51 of the first embodiment. For convenience in description, like reference signs designate identical constituent features throughout the drawings between this embodiment and the first embodiment. These constituent features will not be elaborated upon.

Figure 15:
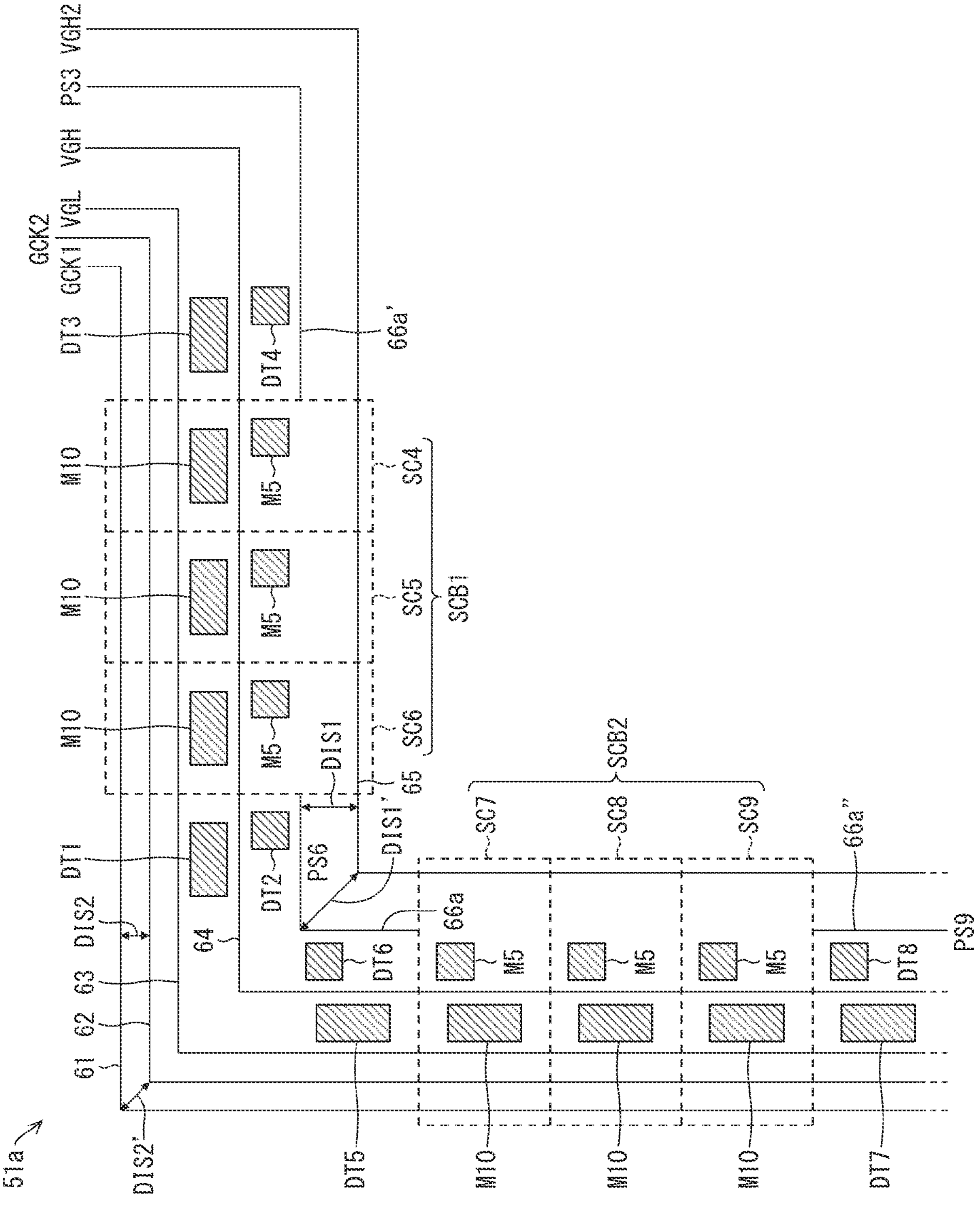
FIG. 15 is a plan view of a portion of a scan drive circuit included in a display device according to a second embodiment.

FIG. 15 is a plan view of a portion of the scan drive circuit 51*a* included in the display device according to the second embodiment.

As illustrated in FIG. 15, in the scan drive circuit 51*a*, the distances DIS1 and DIS1' between the set signal lines 66*a*, 66*a*', and 66*a*" and the control-signal trunk wire 65 are greater than the distances DIS2 and DIS2' between the first gate-clock-signal trunk wire 61 and the second gate-clock-signal trunk wire 62. In a section in which the set signal lines 66*a*, 66*a*', and 66*a*" are formed in parallel with the control-signal trunk wire 65, the distance DIS1 is found between the set signal lines 66*a*, 66*a*', and 66*a*" and the control-signal trunk wire 65. In a position in which the set signal lines 66*a*, 66*a*', and 66*a*" and the control-signal trunk wire 65 change in extending directions, the distance DIS1' is found between the set signal lines 66*a*, 66*a*', and 66*a*" and the control-signal trunk wire 65. In a section in which the first gate-clock-signal trunk wire 61 is formed in parallel with the second gate-clock-signal trunk wire 62, the distance DIS2 is found between the first gate-clock-signal trunk wire 61 and the second gate-clock-signal trunk wire 62. In a position in which the first gate-clock-signal trunk wire 61 and the second gate-clock-signal trunk wire 62 change in extending directions, the distance DIS2' is found between the first gate-clock-signal trunk wire 61 and the second gate-clock-signal trunk wire 62. The distances DIS1 and DIS1' are respectively greater than the distances DIS2 and DIS2'.

The scan drive circuit 51*a* can reduce fluctuations caused by coupling between the set signal lines 66*a*, 66*a*', and 66*a*" and the control-signal trunk wire 65, and, furthermore, improve image quality of the display device.

Third Embodiment

Described next is a third embodiment of the disclosure, with reference to FIG. 16. A scan drive circuit 51*b* included in a display device of this embodiment differs from the scan drive circuit 51 of the first embodiment in that the scan drive circuit 51*b* includes: first common gate-clock-signal branch wires; and second common gate-clock-signal branch wires. Otherwise, the scan drive circuit 51*b* is the same as the scan drive circuit 51 of the first embodiment. For convenience in description, like reference signs designate identical constituent features throughout the drawings between this embodiment and the first embodiment. These constituent features will not be elaborated upon.

Figure 16:
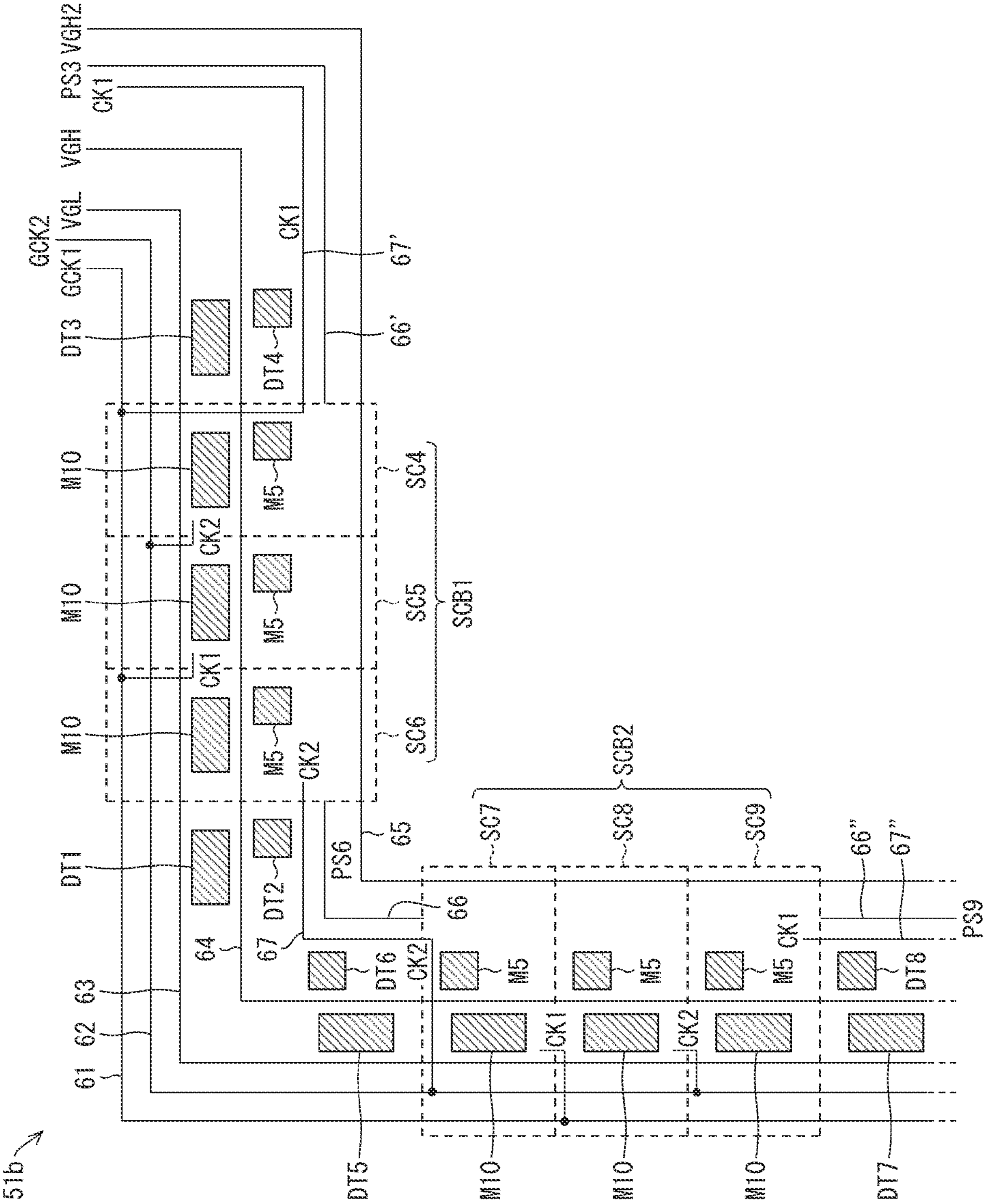
FIG. 16 is a plan view of a portion of a scan drive circuit included in a display device according to a third embodiment.

FIG. 16 is a plan view of a portion of the scan drive circuit 51*b* included in the display device according to the third embodiment.

As illustrated in FIG. 16, in the scan drive circuit 51*b*, two adjacent unit circuits SC5 and SC6 in the first unit circuit block SCB1 are provided with a first common gate-clock-signal branch wire electrically connected to the first gate-clock-signal trunk wire 61. Two adjacent unit circuits SC4 and SC5 in the first unit circuit block SCB1 are provided with a second common gate-clock-signal branch wire electrically connected to the second gate-clock-signal trunk wire 62. Two adjacent unit circuits SC7 and SC8 in the second unit circuit block SCB2 are provided with a first common gate-clock-signal branch wire electrically connected to the first gate-clock-signal trunk wire 61. Two adjacent unit circuits SC8 and SC9 in the second unit circuit block SCB2 are provided with a second common gate-clock-signal branch wire electrically connected to the second gate-clock-signal trunk wire 62. Then, a trunk wire forming region including the control-signal trunk wire 65 is provided between: the unit circuit SC6 included in the plurality of unit circuits SC4 to SC6 in the first unit circuit block SCB1 and disposed closest to the second unit circuit block SCB2; and the unit circuit SC7 included in the plurality of unit circuits SC7 to SC9 in the second unit circuit block SCB2 and disposed closest to the first unit circuit block SCB1. The trunk wire forming region is provided with a second common gate-clock-signal branch wire 67 electrically connected to the second gate-clock-signal trunk wire 62. Furthermore, the scan drive circuit 51*b* includes first common gate-clock-signal branch wires 67' and 67" electrically connected to the first gate-clock-signal trunk wire 61.

The scan drive circuit 51*b* includes either the first common gate-clock-signal branch wire or the second common gate-clock-signal branch wire provided in common between two adjacent unit circuits. Such a feature can reduce the number of the first gate-clock-signal branch wires and the second gate-clock-signal branch wires, reduce fluctuations caused by coupling between the signal lines, and, furthermore, improve image quality of the display device.

Fourth Embodiment

Described next is a fourth embodiment of the disclosure, with reference to FIG. 17. A scan drive circuit 51*c* included in a display device of this embodiment differs from the scan drive circuit 51*b* of the third embodiment in that the scan drive circuit 51*c* omits the second common gate-clock-signal branch wire 67, which is electrically connected to the second gate-clock-signal trunk wire 62, in the trunk wire forming region provided between the first unit circuit block SCB1 and the second unit circuit block SCB2 and including the control-signal trunk wire 65. Otherwise, the scan drive circuit 51*c* of this embodiment is the same as the scan device circuit 51*b* of the third embodiment. For convenience in description, like reference signs designate identical constituent features throughout the drawings between this embodiment and the third embodiment. These constituent features will not be elaborated upon.

Figure 17:
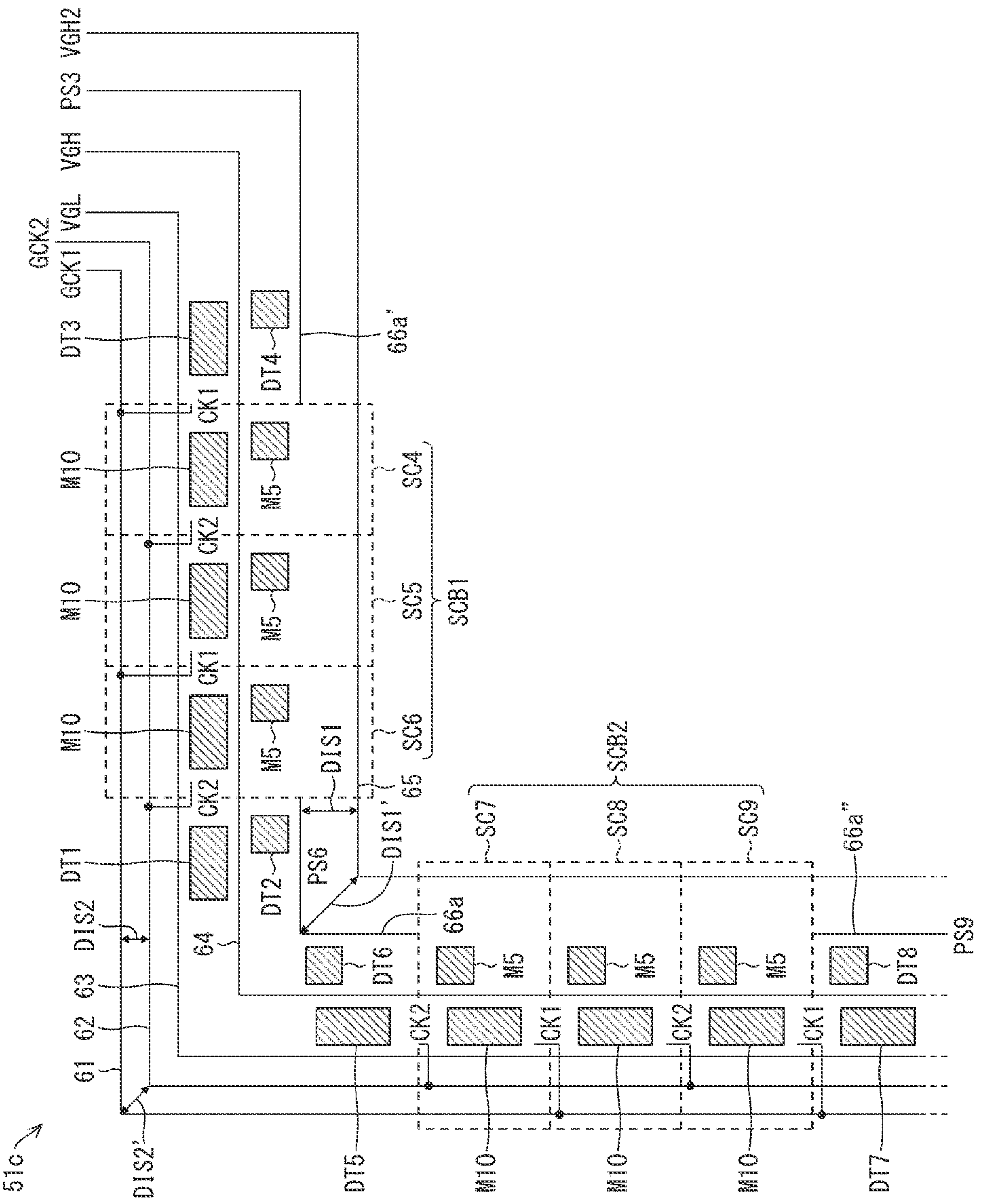
FIG. 17 is a plan view of a portion of a scan drive circuit included in a display device according to a fourth embodiment.

FIG. 17 is a plan view of a portion of the scan drive circuit 51*c* included in the display device according to the fourth embodiment.

As illustrated in FIG. 17, in the scan drive circuit 51*c*, two adjacent unit circuits SC5 and SC6 in the first unit circuit block SCB1 are provided with a first common gate-clock-signal branch wire electrically connected to the first gate-clock-signal trunk wire 61. Two adjacent unit circuits SC4 and SC5 in the first unit circuit block SCB1 are provided with a second common gate-clock-signal branch wire electrically connected to the second gate-clock-signal trunk wire 62. Two adjacent unit circuits SC7 and SC8 in the second unit circuit block SCB2 are provided with a first common gate-clock-signal branch wire electrically connected to the first gate-clock-signal trunk wire 61. Two adjacent unit circuits SC8 and SC9 in the second unit circuit block SCB2 are provided with a second common gate-clock-signal branch wire electrically connected to the second gate-clock-signal trunk wire 62. Then, the unit circuit SC6, which is included in the plurality of unit circuits SC4 to SC6 in the first unit circuit block SCB1 and disposed closest to the second unit circuit block SCB2, includes a gate-clock-signal branch wire electrically connected to the second gate-clock-signal trunk wire 62. The unit circuit SC7, which is included in the plurality of unit circuits SC7 to SC9 in the second unit circuit block SCB2 and disposed closest to the first unit circuit block SCB1, includes a gate-clock-signal branch wire that is separate from the gate-clock-signal branch wire of the unit circuit SC6 and electrically connected to the second gate-clock-signal trunk wire 62.

The scan drive circuit 51*c* omits the second common gate-clock-signal branch wire 67 (see FIG. 16), which is electrically connected to the second gate-clock-signal trunk wire 62, in the trunk wire forming region provided between the first unit circuit block SCB1 and the second unit circuit block SCB2 and including the control-signal trunk wire 65. Such a feature can reduce fluctuations caused by coupling between the signal lines, and, furthermore, improve image quality of the display device.

SUMMARY

First Aspect

A display device comprising: a substrate; a display region provided on the substrate; and a picture-frame region provided on the substrate and disposed outside the display region, the display region including a plurality of subpixels and a subpixel drive circuit included in each of the plurality of subpixels, wherein the picture-frame region includes:

a first gate-clock-signal trunk wire; a second gate-clock-signal trunk wire supplied with a clock signal different from a clock signal supplied to the first gate-clock-signal trunk wire; a first constant-voltage trunk wire and; a second constant-voltage trunk wire supplied with a constant voltage higher than a constant voltage supplied to the first constant-voltage trunk wire, all of which are provided along the picture-frame region;

a unit circuit provided with a transistor including a first oxide semiconductor layer, a first gate electrode, a first source electrode, and a first drain electrode, the unit circuit being configured to output at least one or more output signals to the subpixel drive circuit of a corresponding subpixel included in the plurality of subpixels, and the at least one or more output signals being output in accordance with a first gate clock signal from the first gate-clock-signal trunk wire, a second gate clock signal from the second gate-clock-signal trunk wire, a first constant voltage from the first constant-voltage trunk wire, a second constant voltage from the second constant-voltage trunk wire, and a set signal;

a first unit circuit block provided along a section of a region in which the first gate-clock-signal trunk wire, the second gate-clock-signal trunk wire, the first constant-voltage trunk wire, and the second constant-voltage trunk wire extend, the first unit circuit block including a plurality of the unit circuits arranged side by side in a first direction of the substrate;

a second unit circuit block provided along another section of the region in which the first gate-clock-signal trunk wire, the second gate-clock-signal trunk wire, the first constant-voltage trunk wire, and the second constant-voltage trunk wire extend, the second unit circuit block including the plurality of unit circuits arranged side by side in a second direction of the substrate, and the second direction being not in parallel with the first direction; and a trunk wire forming region provided between the first unit circuit block and the second unit circuit block, and including the first gate-clock-signal trunk wire, the second gate-clock-signal trunk wire, the first constant-voltage trunk wire, and the second constant-voltage trunk wire, the trunk line forming region is provided with a set signal line supplied with the set signal sent from a unit circuit included in the plurality of unit circuits in the first unit circuit block and provided closest to the second unit circuit block to a unit circuit included in the plurality of unit circuits in the second unit circuit block and provided closest to the first unit circuit block, and the trunk line forming region is provided with one or more dummy elements each including: a second oxide semiconductor layer formed of a same material as a material of the first oxide semiconductor layer; and a second gate electrode formed of a same material as a material of the first gate electrode overlapping with the second oxide semiconductor layer in plan view.

Second Aspect

The display device according to the first aspect, wherein the picture-frame region includes a modified-shaped portion connecting together rectangular picture-frame regions, and the first unit circuit block, the second unit circuit block, the one or more dummy elements, and the set signal line are provided to the modified-shaped portion.

Third Aspect

The display device according to the second aspect, wherein the display region includes a modified-shaped end portion formed along the modified-shaped portion of the picture-frame region.

Fourth Aspect

The display device according to any one of the first to fourth aspects, wherein the picture-frame region further includes a control-signal trunk wire provided along the picture-frame region and supplied with a control signal that selects a drive period and a suspension period of the unit circuit, and the unit circuit outputs the at least one or more output signals to the subpixel drive circuit of a corresponding subpixel included in the plurality of subpixels, the at least one or more output signals being output in accordance with the first gate clock signal from the first gate-clock-signal trunk wire, the second gate clock signal from the second gate-clock-signal trunk wire, the first constant voltage from the first constant-voltage trunk wire, the second constant voltage from the second constant-voltage trunk wire, the set signal, and the control signal of the control-signal trunk wire.

Fifth Aspect

The display device according to the fourth aspect, wherein, between the first unit circuit block and the second unit circuit block, a distance between the set signal line and the control-signal trunk wire is greater than a distance between the first gate-clock-signal trunk wire and the second gate-clock-signal trunk wire.

Sixth Aspect

The display device according to the fourth aspect, wherein two adjacent unit circuits, included in the plurality of unit circuits in the first unit circuit block and disposed closest to the second unit circuit block, are provided with a first common gate-clock-signal branch wire electrically connected to one of the first gate-clock-signal trunk wire or the second gate-clock-signal trunk wire, two adjacent unit circuits, included in the plurality of unit circuits in the second unit circuit block and disposed closest to the first unit circuit block, are provided with the first common gate-clock-signal branch wire, and the trunk wire forming region including the control-signal trunk wire is provided between: a unit circuit included in the plurality of unit circuits in the first unit circuit block and disposed closest to the second unit circuit block; and a unit circuit included in the plurality of unit circuits in the second unit circuit block and disposed closest to the first unit circuit block, the trunk wire forming region being provided with a second common gate-clock-signal branch wire electrically connected to another one of the first gate-clock-signal trunk wire or the second gate-clock-signal trunk wire.

Seventh Aspect

The display device according to the fourth aspect or the fifth aspect, wherein two adjacent unit circuits, included in the plurality of unit circuits in the first unit circuit block and disposed closest to the second unit circuit block, are provided with a first common gate-clock-signal branch wire electrically connected to one of the first gate-clock-signal trunk wire or the second gate-clock-signal trunk wire, two adjacent unit circuits, included in the plurality of unit circuits in the second unit circuit block and disposed closest to the first unit circuit block, are provided with the first common gate-clock-signal branch wire, and each of a unit circuit included in the plurality of unit circuits in the first unit circuit block and disposed closest to the second unit circuit block, and a unit circuit included in the plurality of unit circuits in the second unit circuit block and disposed closest to the first unit circuit block, includes a gate-clock-signal branch wire electrically connected to another one of the first gate-clock-signal trunk wire or the second gate-clock-signal trunk wire.

Eighth Aspect

The display device according to any one of the first to seventh aspects, wherein the second gate electrode is a floating electrode not electrically connected to any of the wires.

Ninth Aspect

The display device according to any one of the first to seventh aspects, wherein the at least one or more dummy elements include a dummy transistor, the dummy transistor further includes: a second source electrode formed of a same material as a material of the first source electrode; and a second drain electrode formed of a same material as a material of the first drain electrode, and the second gate electrode, the second source electrode, and the second drain electrode are electrically connected to the first constant-voltage trunk wire.

Tenth Aspect

The display device according to any one of the first to seventh aspects, wherein the at least one or more dummy elements include a dummy transistor, the dummy transistor further includes: a second source electrode formed of a same material as a material of the first source electrode; and a second drain electrode formed of a same material as a material of the first drain electrode, and the second gate electrode, the second source electrode, and the second drain electrode are electrically connected to the first constant-voltage trunk wire.

Eleventh Aspect

The display device according to any one of the first to eighth aspects, wherein the one or more dummy elements include a plurality of dummy elements, the plurality of dummy elements include a first dummy element and a second dummy element, the first dummy element and a plurality of the transistors included in the first unit circuit block most closely adjacent to the first dummy element are provided so that two of the transistors adjacent to each other and included in the first unit circuit block are distant from each other, and the second dummy element and the transistors included in the second unit circuit block most closely adjacent to the second dummy element are provided so that two of the transistors adjacent to each other and included in the second unit circuit block are distant from each other.

Twelfth Aspect

The display device according to the ninth aspect or the tenth aspect, wherein the dummy transistor includes a plurality of dummy transistors, the plurality of dummy transistors include a first dummy transistor and a second dummy transistor, the first dummy transistor and a plurality of the transistors included in the first unit circuit block most closely adjacent to the first dummy transistor are provided so that two of the transistors adjacent to each other and included in the first unit circuit block are distant from each other, and the second dummy transistor and a plurality of the transistors included in the second unit circuit block most closely adjacent to the second dummy transistor are provided so that two of the transistors adjacent to each other and included in the second unit circuit block are distant from each other.

Thirteenth Aspect

The display device according to any one of the first to twelfth aspects, wherein the subpixel drive circuit includes: a first transistor that is an N-type transistor; and a second transistor that is a P-type transistor, and the unit circuit outputs: a first output signal that is an output signal to control the first transistor; and a second output signal that is an output signal to control the second transistor.

Fourteenth Aspect

The display device according to the thirteenth aspect, wherein the first transistor includes an oxide semiconductor layer, and the second transistor includes a polycrystalline silicon layer.

Fifteenth Aspect

The display device according to the fourteenth aspect, wherein the unit circuit further includes a third transistor including a polycrystalline silicon layer, the first oxide semiconductor layer of the transistor included in the unit circuit and the oxide semiconductor layer of the first transistor included in the subpixel drive circuit are made of a same material, and the polycrystalline silicon layer of the third transistor included in the unit circuit and the polycrystalline silicon layer of the second transistor included in the subpixel drive circuit are made of a same material.

Sixteenth Aspect

The display device according to the first to fifteenth aspects, wherein the first oxide semiconductor layer is formed of a compound containing: at least one element selected from the group consisting of indium (In), gallium (Ga), tin (Sn), hafnium (Hf), zirconium (Zr), and zinc (Zn); and oxygen.

Additional Remarks

The disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure. Moreover, the technical aspects disclosed in each embodiment may be combined together to achieve a new technical feature.

INDUSTRIAL APPLICABILITY

The disclosure is applicable to a display device.

The invention claimed is:

1. A display device, comprising:

a substrate; a display region provided on the substrate; and a picture-frame region provided on the substrate and disposed outside the display region, the display region including a plurality of subpixels and a subpixel drive circuit included in each of the plurality of subpixels, wherein the picture-frame region includes:

a first gate-clock-signal trunk wire; a second gate-clock-signal trunk wire supplied with a clock signal different from a clock signal supplied to the first gate-clock-signal trunk wire; a first constant-voltage trunk wire; and a second constant-voltage trunk wire supplied with a constant voltage higher than a constant voltage supplied to the first constant-voltage trunk wire, all of which are provided along the picture-frame region;

a unit circuit provided with a transistor including a first oxide semiconductor layer, a first gate electrode, a first source electrode, and a first drain electrode, the unit circuit being configured to output one or more output signals to the subpixel drive circuit of a corresponding subpixel included in the plurality of subpixels, and the one or more output signals being output in accordance with a first gate clock signal from the first gate-clock-signal trunk wire, a second gate clock signal from the second gate-clock-signal trunk wire, a first constant voltage from the first constant-voltage trunk wire, a second constant voltage from the second constant-voltage trunk wire, and a set signal;

a first unit circuit block provided along a section of a region in which the first gate-clock-signal trunk wire, the second gate-clock-signal trunk wire, the first constant-voltage trunk wire, and the second constant-voltage trunk wire extend, the first unit circuit block including a plurality of unit circuits, including the unit circuit, arranged side by side in a first direction of the substrate;

a second unit circuit block provided along another section of the region in which the first gate-clock-signal trunk wire, the second gate-clock-signal trunk wire, the first constant-voltage trunk wire, and the second constant-voltage trunk wire extend, the second unit circuit block including a plurality of unit circuits arranged side by side in a second direction of the substrate, and the second direction being not in parallel with the first direction; and a trunk wire forming region provided between the first unit circuit block and the second unit circuit block, and including the first gate-clock-signal trunk wire, the second gate-clock-signal trunk wire, the first constant-voltage trunk wire, and the second constant-voltage trunk wire, the trunk wire forming region is provided with a set signal line supplied with the set signal sent from a unit circuit included in the plurality of unit circuits in the first unit circuit block and provided closest to the second unit circuit block to a unit circuit included in the plurality of unit circuits in the second unit circuit block and provided closest to the first unit circuit block, and the trunk wire forming region is provided with one or more dummy elements, each including:

a second oxide semiconductor layer formed of a same material as a material of the first oxide semiconductor layer; and a second gate electrode formed of a same material as a material of the first gate electrode overlapping with the second oxide semiconductor layer in a plan view.

2. The display device according to claim 1, wherein the picture-frame region includes a modified-shaped portion connecting together rectangular picture-frame regions, and the first unit circuit block, the second unit circuit block, the one or more dummy elements, and the set signal line are provided to the modified-shaped portion.

3. The display device according to claim 2, wherein the display region includes a modified-shaped end portion formed along the modified-shaped portion of the picture-frame region.

4. The display device according to claim 1, wherein the picture-frame region further includes a control-signal trunk wire provided along the picture-frame region and supplied with a control signal that selects a drive period and a suspension period of the unit circuit, and the unit circuit outputs the one or more output signals to the subpixel drive circuit of the corresponding subpixel included in the plurality of subpixels, the one or more output signals being output in accordance with the first gate clock signal from the first gate-clock-signal trunk wire, the second gate clock signal from the second gate-clock-signal trunk wire, the first constant voltage from the first constant-voltage trunk wire, the second constant voltage from the second constant-voltage trunk wire, the set signal, and the control signal of the control-signal trunk wire.

5. The display device according to claim 4, wherein, between the first unit circuit block and the second unit circuit block, a distance between the set signal line and the control-signal trunk wire is greater than a distance between the first gate-clock-signal trunk wire and the second gate-clock-signal trunk wire.

6. The display device according to claim 4, wherein two adjacent unit circuits, included in the plurality of unit circuits in the first unit circuit block and disposed closest to the second unit circuit block, are provided with a first common gate-clock-signal branch wire electrically connected to one of the first gate-clock-signal trunk wire or the second gate-clock-signal trunk wire, two adjacent unit circuits, included in the plurality of unit circuits in the second unit circuit block and disposed closest to the first unit circuit block, are provided with the first common gate-clock-signal branch wire, and the trunk wire forming region including the control-signal trunk wire is provided between: a unit circuit included in the plurality of unit circuits in the first unit circuit block and disposed closest to the second unit circuit block; and a unit circuit included in the plurality of unit circuits in the second unit circuit block and disposed closest to the first unit circuit block, the trunk wire forming region being provided with a second common gate-clock-signal branch wire electrically connected to another one of the first gate-clock-signal trunk wire or the second gate-clock-signal trunk wire.

7. The display device according to claim 4, wherein two adjacent unit circuits, included in the plurality of unit circuits in the first unit circuit block and disposed closest to the second unit circuit block, are provided with a first common gate-clock-signal branch wire electrically connected to one of the first gate-clock-signal trunk wire or the second gate-clock-signal trunk wire, two adjacent unit circuits, included in the plurality of unit circuits in the second unit circuit block and disposed closest to the first unit circuit block, are provided with the first common gate-clock-signal branch wire, and each of a unit circuit included in the plurality of unit circuits in the first unit circuit block and disposed closest to the second unit circuit block, and a unit circuit included in the plurality of unit circuits in the second unit circuit block and disposed closest to the first unit circuit block, includes a gate-clock-signal branch wire electrically connected to another one of the first gate-clock-signal trunk wire or the second gate-clock-signal trunk wire.

8. The display device according to claim 1, wherein the second gate electrode is a floating electrode not electrically connected to any of the wires.

9. The display device according to claim 1, wherein the one or more dummy elements include a dummy transistor, the dummy transistor further includes: a second source electrode formed of a same material as a material of the first source electrode; and a second drain electrode formed of a same material as a material of the first drain electrode, and the second gate electrode, the second source electrode, and the second drain electrode are electrically connected to the second constant-voltage trunk wire.

10. The display device according to claim 1, wherein the one or more dummy elements include a dummy transistor, the dummy transistor further includes: a second source electrode formed of a same material as a material of the first source electrode; and a second drain electrode formed of a same material as a material of the first drain electrode, and the second gate electrode, the second source electrode, and the second drain electrode are electrically connected to the first constant-voltage trunk wire.

11. The display device according to claim 1, wherein the one or more dummy elements include a plurality of dummy elements, the plurality of dummy elements includes a first dummy element and a second dummy element, the first dummy element and the transistor included in the first unit circuit block most closely adjacent to the first dummy element are provided separated by a distance between two of the transistors adjacent to each other and included in the first unit circuit block, and the second dummy element and the transistor included in the second unit circuit block most closely adjacent to the second dummy element are provided separated by a distance between two of the transistors adjacent to each other and included in the second unit circuit block.

12. The display device according to claim 9, wherein the dummy transistor includes a plurality of dummy transistors, the plurality of dummy transistors includes a first dummy transistor and a second dummy transistor, the first dummy transistor and the transistor included in the first unit circuit block most closely adjacent to the first dummy transistor are provided separated by a distance between two of the transistors adjacent to each other and included in the first unit circuit block, and the second dummy transistor and the transistor included in the second unit circuit block most closely adjacent to the second dummy transistor are provided separated by a distance between two of the transistors adjacent to each other and included in the second unit circuit block.

13. The display device according to claim 1, wherein the subpixel drive circuit includes: a first transistor that is an N-type transistor; and a second transistor that is a P-type transistor, and the unit circuit outputs: a first output signal that is an output signal to control the first transistor; and a second output signal that is an output signal to control the second transistor.

14. The display device according to claim 13, wherein the first transistor includes an oxide semiconductor layer, and the second transistor includes a polycrystalline silicon layer.

15. The display device according to claim 14, wherein the unit circuit further includes a third transistor including a polycrystalline silicon layer, the first oxide semiconductor layer of the transistor included in the unit circuit and the oxide semiconductor layer of the first transistor included in the subpixel drive circuit are made of a same material, and the polycrystalline silicon layer of the third transistor included in the unit circuit and the polycrystalline silicon layer of the second transistor included in the subpixel drive circuit are made of a same material.

16. The display device according to claim 1, wherein the first oxide semiconductor layer is formed of a compound containing: at least one element selected from the group consisting of indium (In), gallium (Ga), tin (Sn), hafnium (Hf), zirconium (Zr), and zinc (Zn); and oxygen.

* * * * *